(12) United States Patent
Kuwabara et al.

(10) Patent No.: US 10,720,411 B2
(45) Date of Patent: Jul. 21, 2020

(54) SEMICONDUCTOR DEVICE

(71) Applicant: RENESAS ELECTRONICS CORPORATION, Tokyo (JP)

(72) Inventors: Shinichi Kuwabara, Ibaraki (JP); Yasutaka Nakashiba, Ibaraki (JP); Tetsuya Iida, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/278,927

(22) Filed: Feb. 19, 2019

(65) Prior Publication Data

US 2019/0273066 A1 Sep. 5, 2019

(30) Foreign Application Priority Data

Mar. 2, 2018 (JP) .................... 2018-037573

(51) Int. Cl.
*H01L 27/08* (2006.01)
*H01L 25/065* (2006.01)
(Continued)

(52) U.S. Cl.
CPC ...... *H01L 25/0657* (2013.01); *H01L 21/4825* (2013.01); *H01L 21/565* (2013.01); *H01L 23/3114* (2013.01); *H01L 23/4952* (2013.01); *H01L 23/49513* (2013.01); *H01L 23/49575* (2013.01); *H01L 23/5227* (2013.01); *H01L 25/50* (2013.01); *H01L 28/10* (2013.01); *H02K 11/33* (2016.01); *H01L 2225/06531* (2013.01); *H01L 2225/06558* (2013.01); *H01L 2225/06582* (2013.01)

(58) Field of Classification Search
CPC . H01L 25/56; H01L 25/0657; H01L 21/4825; H01L 21/565; H01L 23/3114; H01L 23/5627
See application file for complete search history.

(56) References Cited

U.S. PATENT DOCUMENTS 8,378,470 B2 2/2013 Nakashiba et al.
2010/0230782 A1* 9/2010 Uchida ............... H01L 25/0655
257/531
(Continued)

FOREIGN PATENT DOCUMENTS

JP 2011-054800 A 3/2011

*Primary Examiner* — Phuc T Dang
(74) *Attorney, Agent, or Firm* — McDermott Will & Emery LLP

(57) ABSTRACT

A semiconductor device includes a first semiconductor chip having a first inductor element and a second inductor element on a first main surface side, a second semiconductor chip having a third inductor element on a second main surface side, and a third semiconductor chip having a fourth inductor element on a third main surface side. The first and second inductor elements are arranged to be separated from each other in a first direction of the first main surface, the first and second main surfaces face each other, and the first and third inductor elements overlap each other. The first and third main surfaces face each other, the second and fourth inductor elements overlap each other, and a creepage distance between the second and third semiconductor chips is larger than a separation distance between the second and third semiconductor chips.

14 Claims, 22 Drawing Sheets

(51) Int. Cl.
*H02K 11/33* (2016.01)
*H01L 23/31* (2006.01)
*H01L 23/495* (2006.01)
*H01L 21/48* (2006.01)
*H01L 21/56* (2006.01)
*H01L 25/00* (2006.01)
*H01L 49/02* (2006.01)
*H01L 23/522* (2006.01)

(56) References Cited

U.S. PATENT DOCUMENTS

| | | | |
|---|---|---|---|
| 2010/0264515 A1* | 10/2010 | Nakashiba | H01L 23/48 257/531 |
| 2014/0217546 A1* | 8/2014 | Yen | H01L 23/5227 257/531 |
| 2015/0333038 A1* | 11/2015 | Hatakeyama | H01L 25/0657 257/777 |
| 2018/0122772 A1* | 5/2018 | Kim | H01L 23/5383 |
| 2019/0006291 A1* | 1/2019 | Neal | H01L 23/3135 |

* cited by examiner

SEMICONDUCTOR DEVICE

CROSS-REFERENCE TO RELATED APPLICATION

The present application claims priority from Japanese Patent Application No. 2018-037573 filed on Mar. 2, 2018, the content of which is hereby incorporated by reference into this application.

TECHNICAL FIELD OF THE INVENTION

The present invention relates to a semiconductor device and relates to, for example, a technique effectively applied to a semiconductor device that performs signal transfer between semiconductor chips by using inductive coupling between inductor elements.

BACKGROUND OF THE INVENTION

Japanese Patent Application Laid-Open Publication No. 2011-54800 (Patent Document 1) discloses a semiconductor device that performs signal transfer between a first semiconductor chip and a second semiconductor chip by using inductive coupling between inductor elements. A first inductor element is formed in the first semiconductor chip, a second inductor element is formed in the second semiconductor chip, and the first inductor element and the second inductor element overlap each other in plan view.

SUMMARY OF THE INVENTION

The inventors of the present invention have studied a semiconductor device in which a first semiconductor chip having a first inductor element and a second inductor element, a second semiconductor chip having a third inductor element, and a third semiconductor chip having a fourth inductor element are stored in a sealing body. In addition, signal transfer between the first semiconductor chip and the second semiconductor chip is performed by using inductive coupling between the first inductor element and the third inductor element which overlap each other in plan view. Signal transfer between the first semiconductor chip and the third semiconductor chip is performed by using inductive coupling between the second inductor element and the fourth inductor element which overlap each other in plan view.

The inventors of the present invention have studied an application of the semiconductor device described above to a motor control system. A motor is driven by a high-side IGBT and a low-side IGBT which are connected in series. For example, the second semiconductor chip supplies a control signal to the high-side IGBT, whereas the third semiconductor chip supplies a control signal to the low-side IGBT, so that a large potential difference occurs between the second semiconductor chip and the third semiconductor chip.

To ensure a withstand voltage between the second semiconductor chip and the third semiconductor chip, it is required to sufficiently ensure a separation distance between the second semiconductor chip and the third semiconductor chip. Thus, the inventors of the present invention have confirmed a problem in which size of the semiconductor device is increased. Since an increase in the size of the semiconductor device leads to an increase in size of the motor control system, it is necessary to downsize the semiconductor device.

Other problems and novel characteristics will be apparent from the descriptions in the present specification and attached drawings.

A semiconductor device according to an embodiment includes: a first semiconductor chip having a first inductor element and a second inductor element between a first semiconductor substrate and a first main surface in cross-sectional view; a second semiconductor chip having a third inductor element between a second semiconductor substrate and a second main surface in cross-sectional view; and a third semiconductor chip having a fourth inductor element between a third semiconductor substrate and a third main surface in cross-sectional view. In addition, the first inductor element and the second inductor element are arranged to be separated from each other in a first direction of the first main surface, the first main surface and the second main surface face each other, and the first inductor element and the third inductor element overlap each other in plan view. Further, the first main surface and the third main surface face each other, and the second inductor element and the fourth inductor element overlap each other in plan view, and a creepage distance between the second semiconductor chip and the third semiconductor chip is larger than a separation distance between the second semiconductor chip and the third semiconductor chip.

According to the embodiment, a semiconductor device can be downsized.

DESCRIPTION OF PREFERRED EMBODIMENTS

Figure 1:
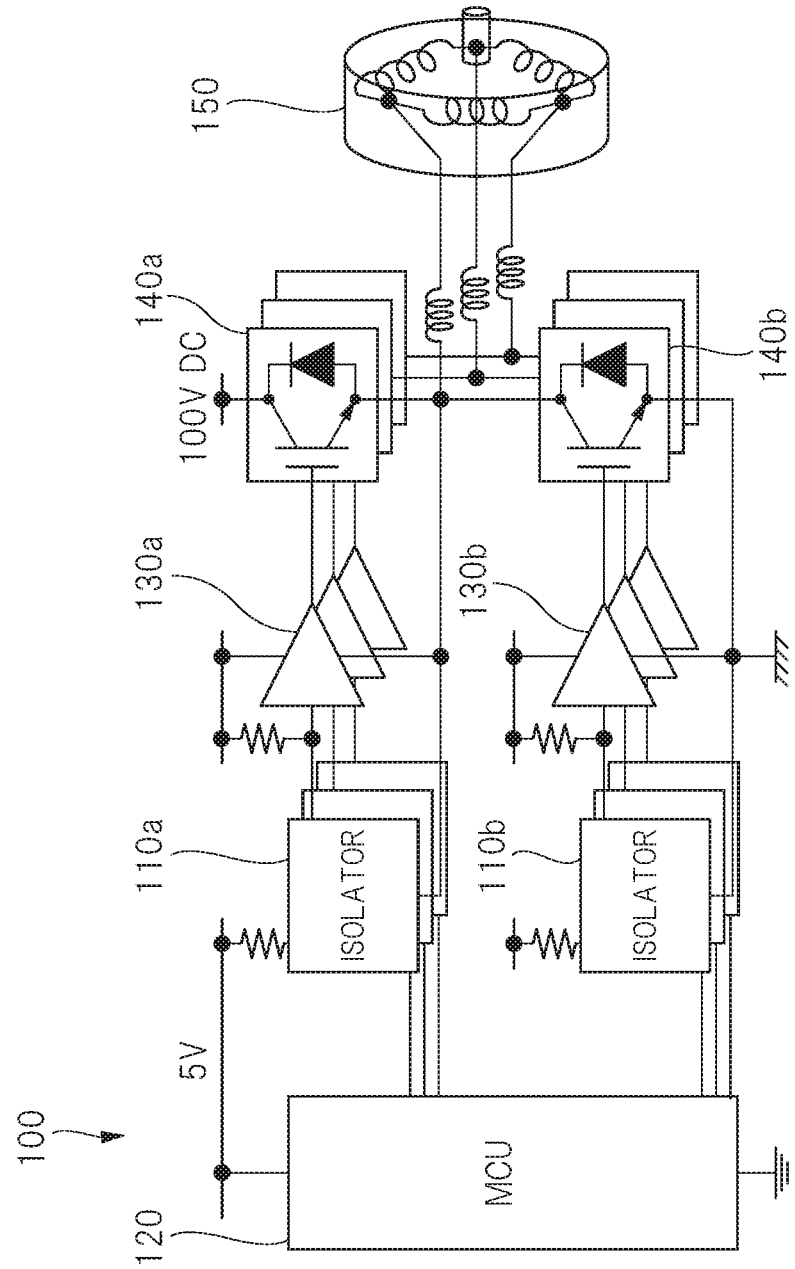
FIG. 1 is a configuration diagram of a motor control system according to a present embodiment.

The following embodiment will be, if necessary, for convenience, described by being divided into a plurality of embodiments or sections. However, unless otherwise stated, they are not unrelated to each other, and are in a relationship in which one is a variation, details, or a supplementary explanation of a part or all of the other one. In addition, in the following embodiment, when referring to the number of elements and the like (including number of pieces, numerical value, amount, range, etc.), unless otherwise stated or clearly limited to a specific number in principle, they are not limited to the specific number and may be more or less than the specific number.

Furthermore, in the following embodiment, it goes without saying that, unless otherwise stated or clearly considered to be essential in principle, the components thereof (including component steps, etc.) are not necessarily essential.

Similarly, in the following embodiment, when referring to the shapes, positional relationship and the like of the components, unless otherwise stated and clearly considered to be a different case in principle, components and the like the shape and the like of which are substantially similar or proximate to that of the embodiment are included. The same is true for the numerical value and range described above.

Also, the same components are denoted by the same reference symbols throughout the drawings for describing the embodiments, and a repetitive description thereof is omitted. In addition, hatched lines may be added even in plan view to facilitate understanding of the drawing.

(Embodiment)

<Motor Control System>

FIG. 1 is a configuration diagram of a motor control system according to a present embodiment.

As illustrated in FIG. 1, a motor control system 100 includes a plurality of isolators 110a and 110b, an MCU 120, a plurality of gate drivers 130a and 130b, a plurality of IGBTs (Insulated Gate Bipolar Transistors) 140a and 140b, and a motor 150. Instead of the IGBT, a power MOSFET can be used.

The motor 150 is a three-phase motor having coils of U-phase, V-phase, and W-phase. The IGBT 140a that is a high-side motor driver and the IGBT 140b that is a low-side motor driver are connected to each of the U-phase, V-phase and W-phase. The isolators 110a and 110b are connected to each of the high-side and low-side phases of the motor 150 via the gate drivers 130a and 130b.

The MCU 120 is connected to the isolators 110a and 110b and transmits a control signal to the IGBTs 140a and 140b via the isolators 110a and 110b and the gate drivers 130a and 130b to alternately switch the IGBTs 140a and 140b. The high-side IGBT 140a flows a current in the motor 150 and the low-side IGBT 140b pulls out the current from the motor 150, so that the motor 150 is rotationally driven.

As illustrated in FIG. 1, a power voltage on the MCU 120 side is, for example, 5 V, and a power voltage of the IGBT 140a and the motor 150 side is, for example, 100 V. Accordingly, as there is a difference of about 100 V between reference potentials of the MCU 120 side and the IGBTs 140a and 140b and the motor 150 side, it is impossible to directly transmit a control signal. Thus, to transmit a control signal from the MCU 120 to the motor 150, the isolators 110a and 110b are interposed for insulating circuits at different potentials in a DC (direct-current) manner. Inductor elements are used as insulating elements of the isolators 110a and 110b. As the insulating elements mutually transmit and receive signals by AC (alternate-current) coupling via an insulating film, it is possible to absorb the difference in reference potential between the transmitting and receiving circuits.

Figure 2:
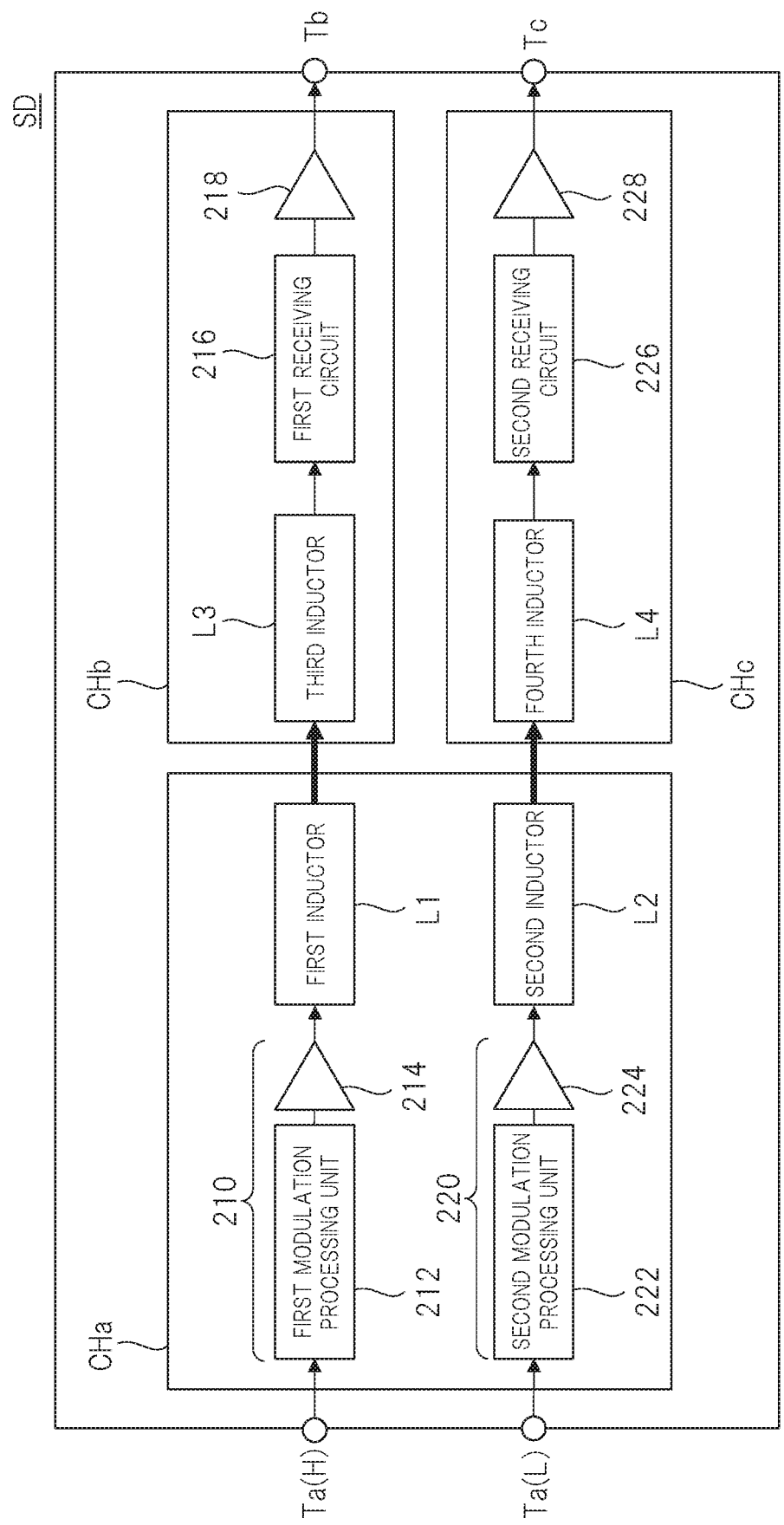
FIG. 2 is a configuration diagram of the semiconductor device according to the present embodiment.

FIG. 2 is a configuration diagram of the semiconductor device according to the present embodiment. The semiconductor device SD corresponds to the isolators 110a and 110b, and the isolators 110a and 110b are mounted in one package. In other words, the semiconductor device SD is an isolator in view of the way it works. As illustrated in FIG. 2, the semiconductor device SD includes three semiconductor chips CHa, CHb and CHc. The semiconductor chip CHa and the semiconductor chip CHb illustrated in FIG. 2 configure the isolator 110a illustrated in FIG. 1, and the semiconductor chip CHa and the semiconductor chip CHc illustrated in FIG. 2 configure the isolator 110b illustrated in FIG. 1. The semiconductor chip CHa includes a first modulation processing unit 212, a first driver circuit 214, a first inductor L1, a second modulation processing unit 222, a second driver circuit 214, and a second inductor L2. Note that the first modulation processing unit 212 and the first driver circuit 214 configure a first transmitting circuit 210, and the second modulation processing unit 222 and the second diver circuit 224 configure the second transmitting circuit 220. The semiconductor chip CHb includes the third inductor L3, a first receiving circuit 216, and a third driver circuit 218, and the semiconductor chip CHc includes a fourth inductor L4, a second receiving circuit 226, and a fourth driver circuit 228.

A first control signal inputted to an external terminal Ta(H) from the MCU 120 illustrated in FIG. 1 is transmitted to the first inductor L1 via the first transmitting circuit 210 as illustrated in FIG. 2, is inputted to the first receiving circuit 216 by using inductive coupling between the first inductor L1 and the third inductor L3, and is outputted to the outside of the semiconductor device SD from an external terminal Tb via the third driver circuit 218. Then, the first control signal is inputted to the IGBT 140a via the gate driver 130a in FIG. 1. In other words, the first control signal is a high-side control signal. The external terminal Ta(H) is one of the terminals among the external terminals Ta to be described later. In addition, as illustrated in FIG. 2, a second control signal inputted to an external terminal Ta(L) from the MCU 120 is transmitted to the second inductor L2 via the second transmitting circuit 220, is inputted to the second receiving circuit 226 by using inductive coupling between the second inductor L2 and the fourth inductor L4, and is outputted to the outside of the semiconductor device SD from an external terminal Tc via the fourth driver circuit 228. Then, the second control signal is inputted to the IGBT 140b via the gate driver 130b in FIG. 1. In other words, the second control signal is a low-side control signal. The external terminal Ta(L) is one of the terminals among the external terminals Ta to be described later.

Here, in the semiconductor chip CHb, the first control signal is operated with an amplitude of 5 V to a reference potential of 100 V, and in the semiconductor chip CHc, the second control signal is operated with an amplitude of 5 V to a reference potential of 0 V. Since a potential difference of 100 V occurs between the semiconductor chip CHb and the semiconductor chip CHc, it is required to sufficiently separate the semiconductor chip CHc from the semiconductor chip CHb to ensure a withstand voltage between the semiconductor chips. However, as the three semiconductor chips CHa, CHb and CHc are mounted in one package, when a separation distance between the semiconductor chip CHb and the semiconductor chip CHc is increased, such a problem that an increase in size of the semiconductor device SD occurs. Note that, when a load voltage of the motor 150 is several hundreds of volts, it is necessary to make the withstand voltage between the semiconductor chip CHb and the semiconductor chip CHc several hundreds of volts.

In other words, the present embodiment aims to achieve downsizing of the semiconductor device SD with ensuring the withstand voltage between the semiconductor chip CHb and the semiconductor chip CHc.

Note that, while the first inductor L1, second inductor L2, third inductor L3, and the fourth inductor L4 are mentioned in FIG. 2, they will be referred to as inductor elements L1 to L4 below since each has a form of an inductor.

<Structure of the Semiconductor Device>

Figure 3:
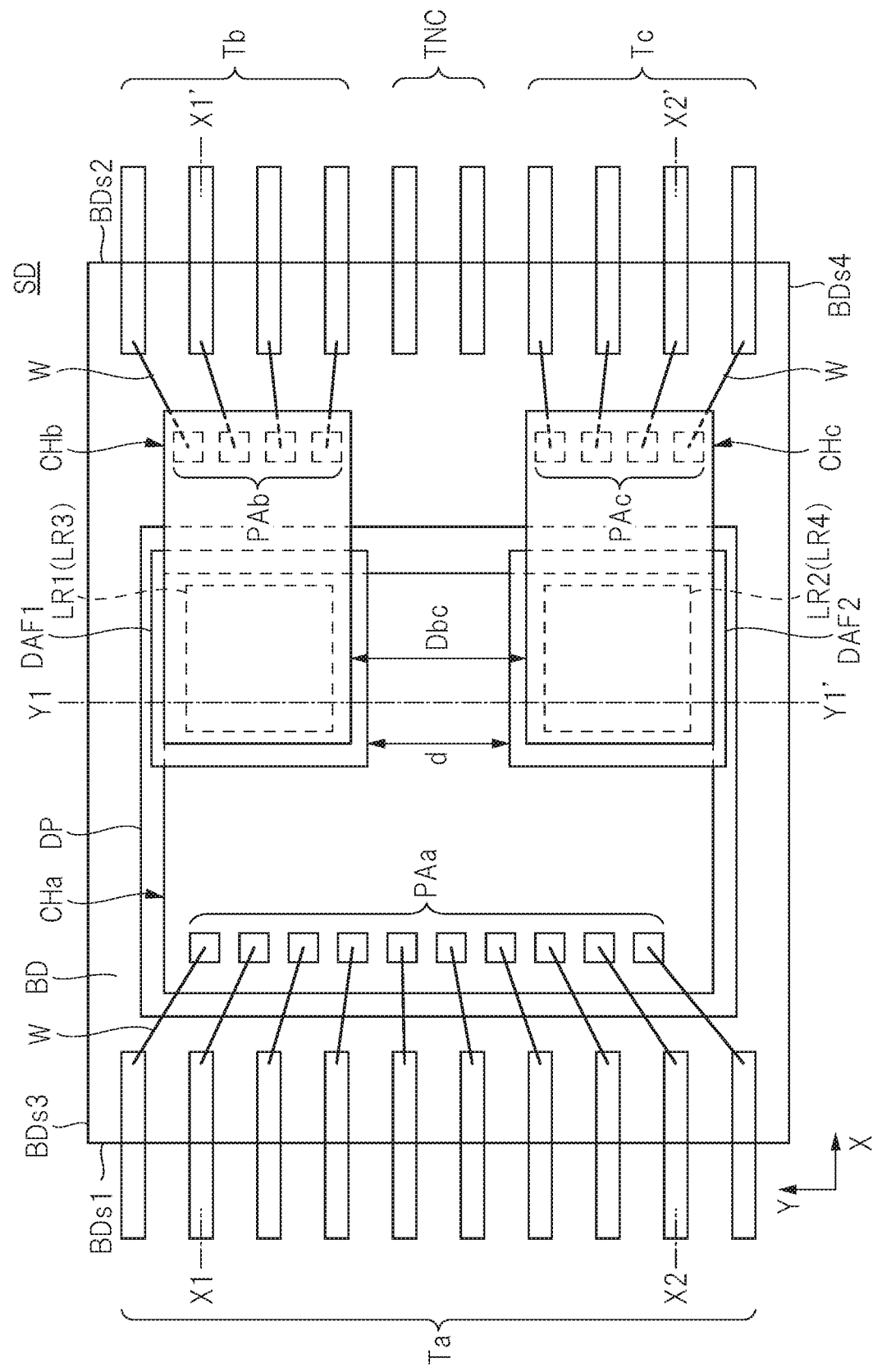
FIG. 3 is a plan view of the semiconductor device according to the present embodiment.
Figure 4:
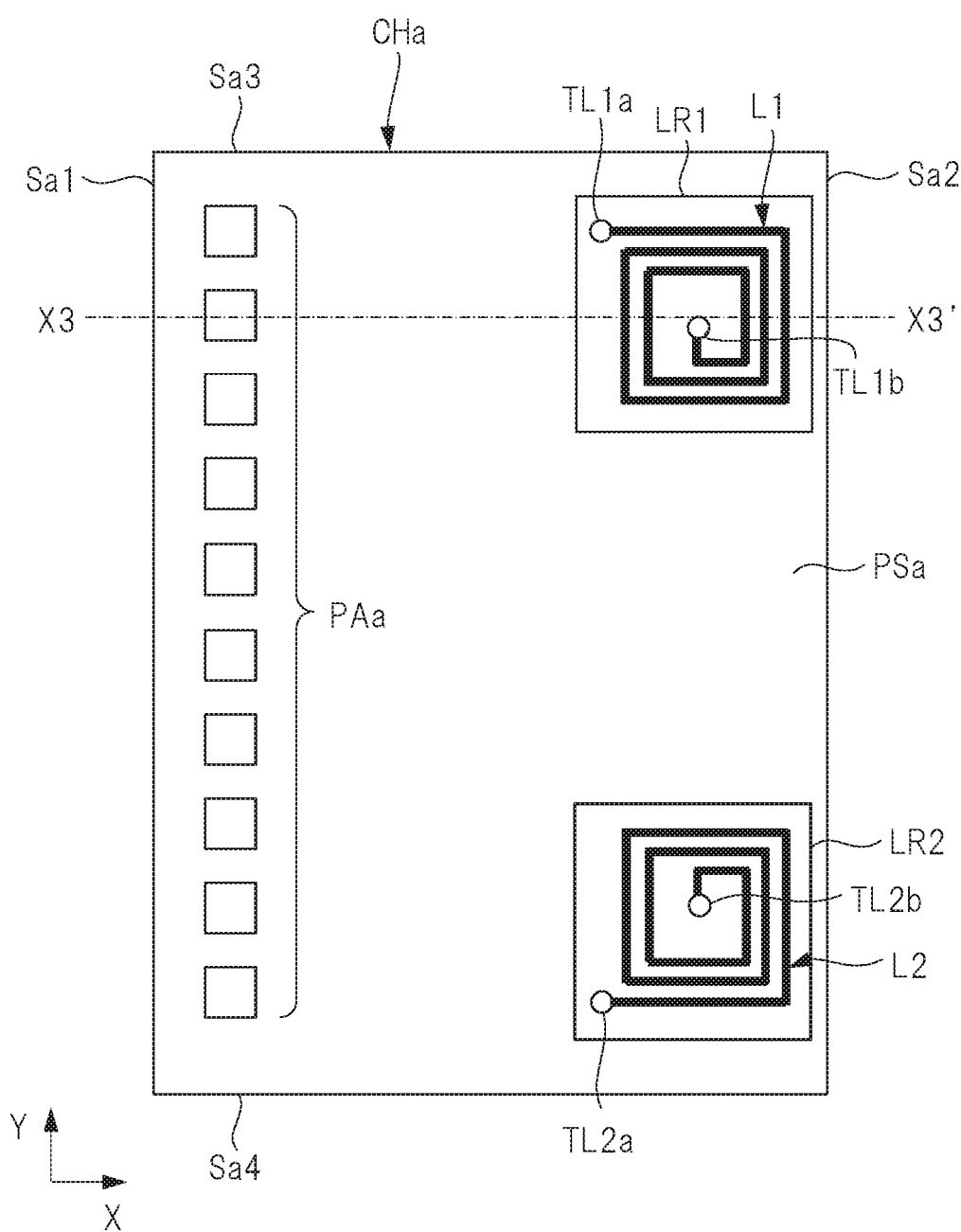
FIG. 4 is a plan view of a semiconductor chip of the semiconductor device of the present embodiment.
Figure 5:
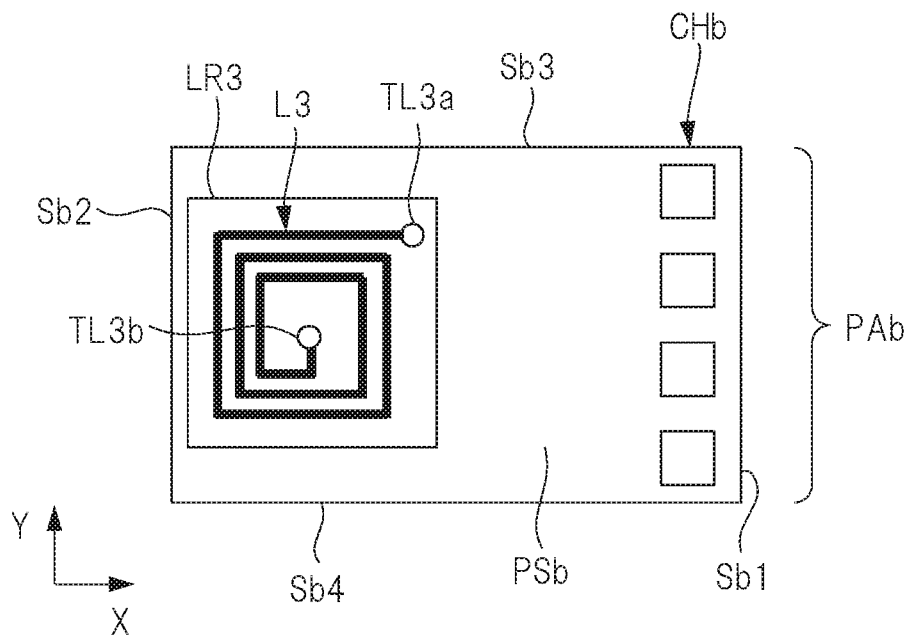
FIG. 5 is a plan view of a semiconductor chip of the semiconductor device of the present embodiment.
Figure 6:
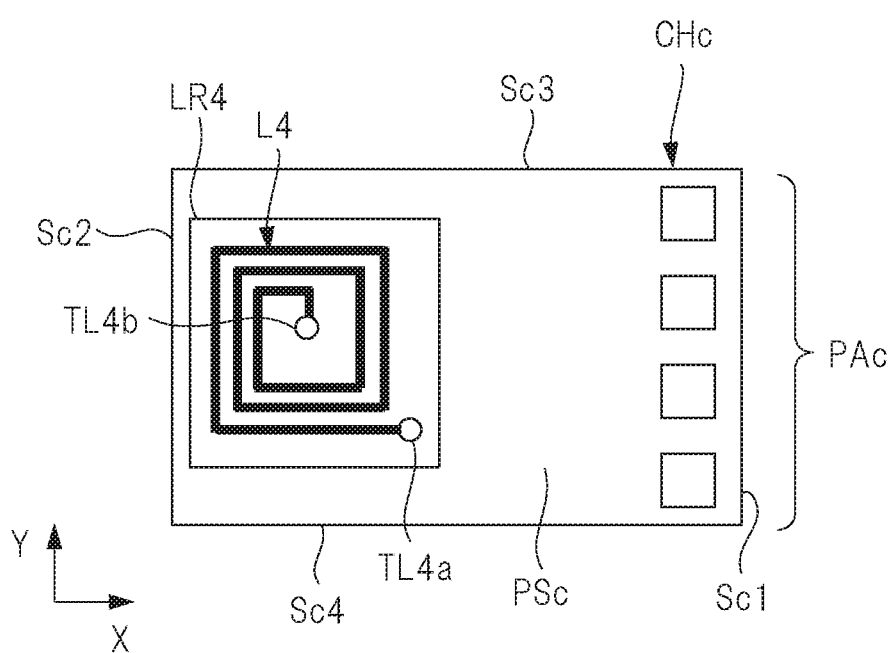
FIG. 6 is a plan view of a semiconductor chip of the semiconductor device of the present embodiment.
Figure 7:
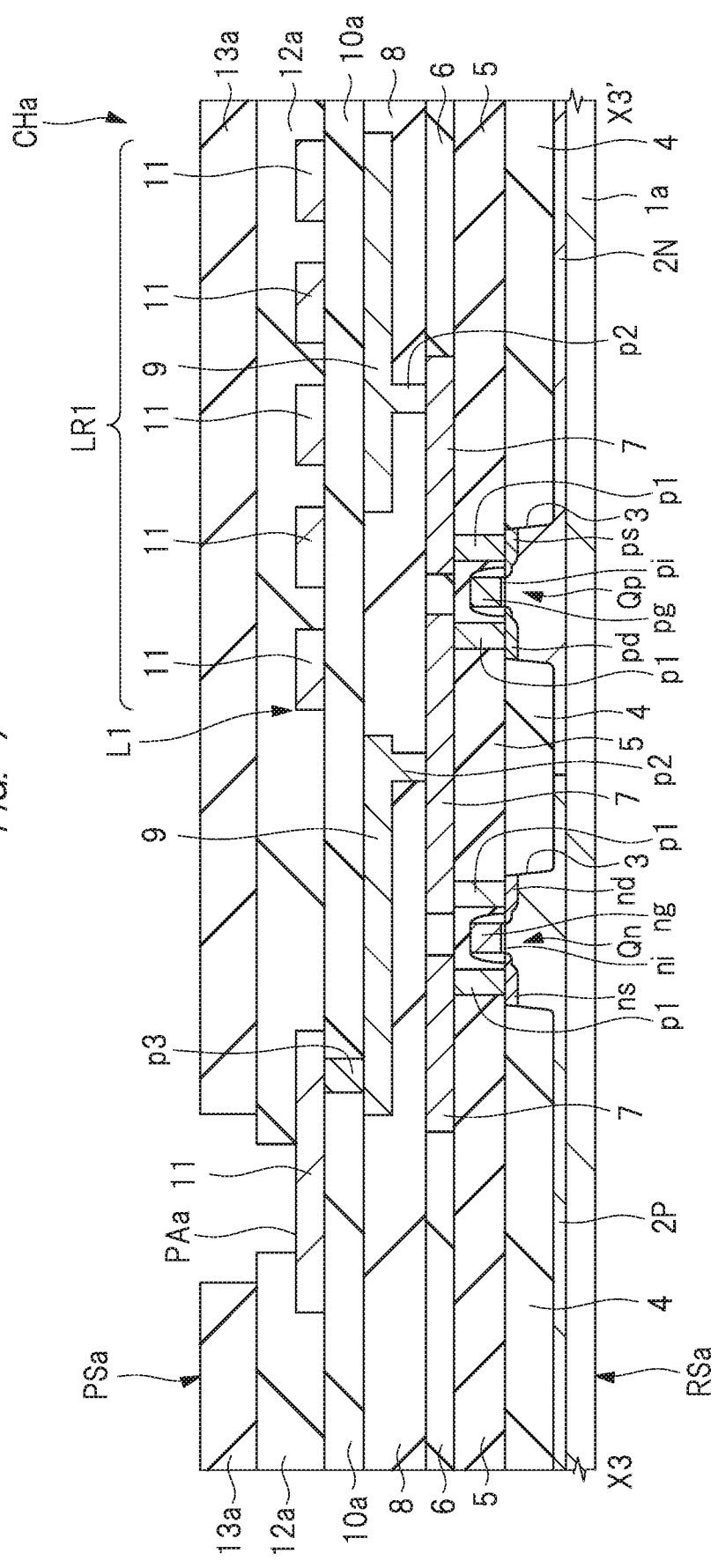
FIG. 7 is a cross-sectional view of main parts taken along line X3-X3' in FIG. 4.
Figure 8:
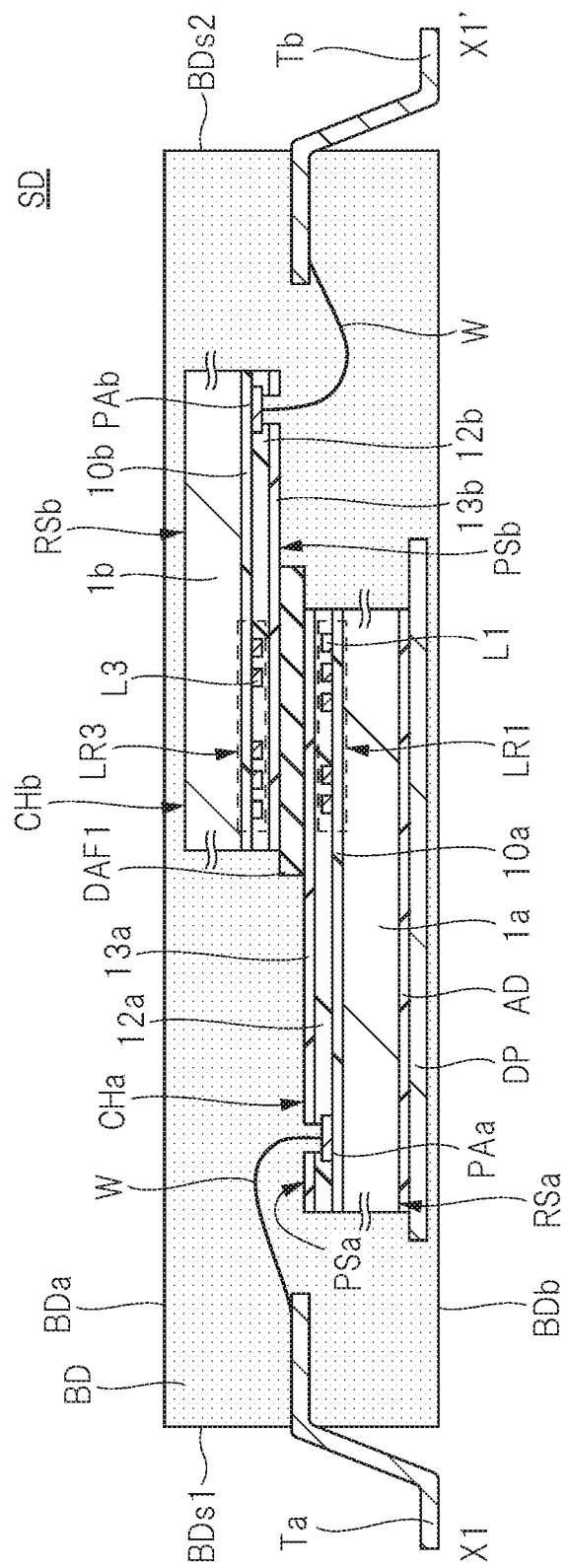
FIG. 8 is a cross-sectional view of main parts taken along line X1-X1' in FIG. 3.
Figure 9:
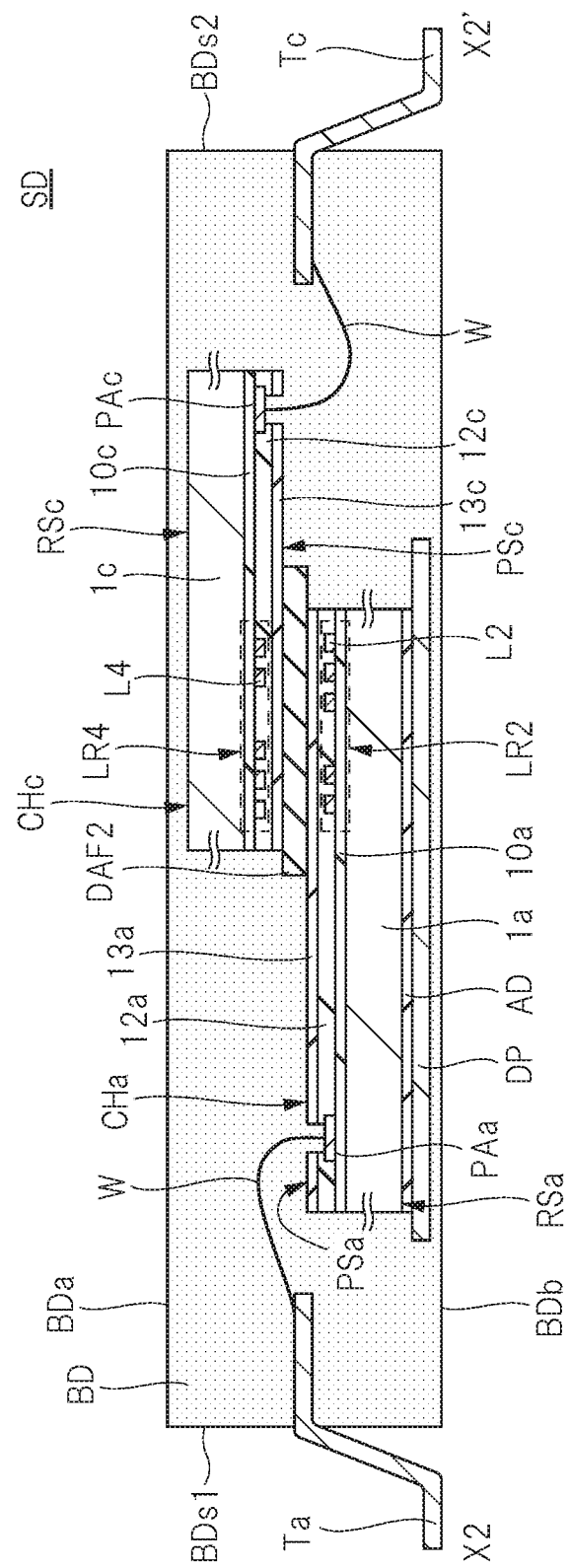
FIG. 9 is a cross-sectional view of main parts taken along line X2-X2' in FIG. 3.
Figure 10:
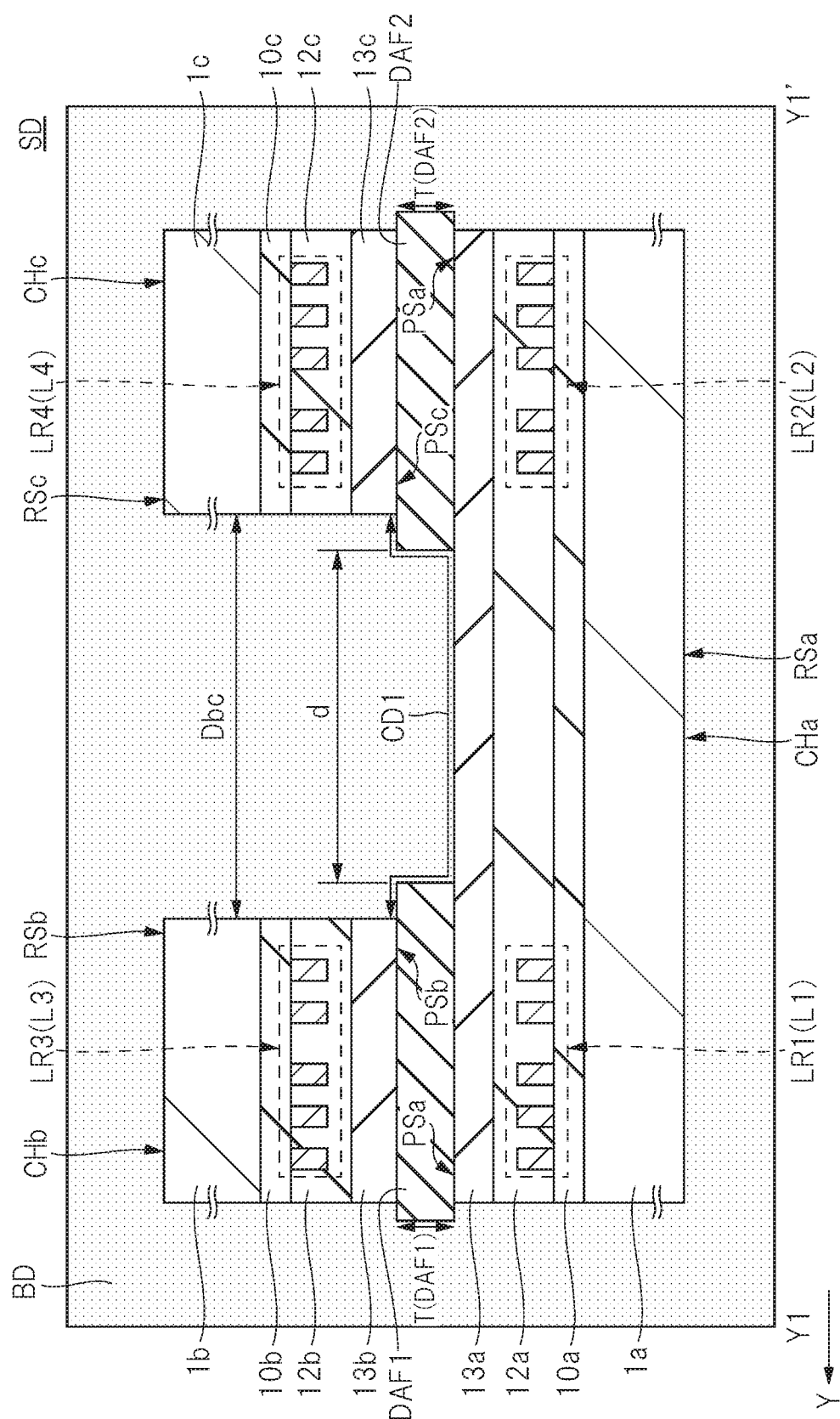
FIG. 10 is a cross-sectional view of main parts taken along line Y1-Y1' in FIG. 3.

FIG. 3 is a top plan view of the semiconductor device SD of the present embodiment. More specifically, FIG. 3 is a perspective top plan view in which the sealing body BD is illustrated by only its outline. FIG. 4 is a plan view of the semiconductor chip CHa of the semiconductor device of the present embodiment, FIG. 5 is a plan view of the semiconductor chip CHb of the semiconductor device of the present embodiment, and FIG. 6 is a plan view of the semiconductor chip CHc of the semiconductor device of the present embodiment. FIG. 7 is a cross-sectional view of main parts taken along line X3-X3' in FIG. 4, FIG. 8 is a cross-sectional view of main parts taken along line X1-X1' in FIG. 3, FIG. 9 is a cross-sectional view of main parts taken along line X2-X2' in FIG. 3, and FIG. 10 is a cross-sectional view of main parts taken along line Y1-Y1' in FIG. 3.

As illustrated in FIG. 4, the semiconductor chip CHa includes a plurality of pad electrodes PAa and two inductor elements L1 and L2. A main surface PSa of the semiconductor chip CHa is in a rectangular shape having two sides Sa1 and Sa2 opposite to each other in an X direction and two sides Sa3 and Sa4 opposite to each other in a Y direction that is orthogonal to the X direction. The plurality of pad electrodes PAa are aligned along the side Sa1 and are arranged to be closer to the side Sa1 than to the side Sa2. The inductor elements L1 and L2 are arranged to be closer to the side Sa2 than to the side Sa1 in the X direction and are aligned along the side Sa2. The inductor elements L1 and L2 are separated from each other in the Y direction. In other words, the inductor element L1 is arranged at a corner portion of the semiconductor chip CHa at which the side Sa2 and the side Sa3 cross each other, and the inductor element L2 is arranged at a corner portion of the semiconductor chip CHa at which the side Sa2 and the side Sa4 cross each other. The inductor element L1 is arranged inside the inductor region LR1, is constituted by a conductive layer arranged in a spiral form in plan view, and has terminals TL1a and TL1b at its ends. The inductor element L2 is arranged inside an inductor region LR2, is constituted by a conductive layer arranged in a spiral form in plan view, and has terminals TL2a and TL2b at its ends.

As illustrated in FIG. 5, the semiconductor chip CHb includes a plurality of pad electrodes PAb and an inductor element L3. A main surface PSb of the semiconductor chip CHb is in a rectangular shape having two sides Sb1 and Sb2 opposite to each other in an X direction and two sides Sb3 and Sb4 opposite to each other in a Y direction that is orthogonal to the X direction. The plurality of pad electrodes PAb are aligned along the side Sb1 and are arranged to be closer to the side Sb1 than to the side Sb2. The inductor element L3 is arranged to be closer to the side Sb2 than to the side Sb1 in the X direction. The inductor element L3 is arranged inside an inductor region LR3, is constituted by a conductive layer arranged in a spiral form in plan view, and has terminals TL3a and TL3b at its ends.

As illustrated in FIG. 6, the semiconductor chip CHc includes a plurality of pad electrodes PAc and the inductor element L4. A main surface PSc of the semiconductor chip CHc is in a rectangular shape having two sides Sc1 and Sc2 opposite to each other in an X direction and two sides Sc3 and Sc4 opposite to each other in a Y direction that is orthogonal to the X direction. The plurality of pad electrodes PAc are aligned along the side Sc1 and are arranged to be closer to the side Sc1 than to the side Sc2. The inductor element L4 is arranged to be closer to the side Sc2 than to the side Sc1 in the X direction. The inductor element L4 is arranged inside an inductor region LR4, is constituted by a conductive layer arranged in a spiral form in plan view, and has terminals TL4a and TL4b at its ends.

Next, a configuration of the semiconductor chip CHa will be described with reference to FIG. 7.

As illustrated in FIG. 7, a p-type well 2P, an n-type well 2N, and a device isolation groove 3 are formed in a semiconductor substrate 1a made of, for example, p-type single crystal silicon, and a device isolation groove 4 made of, for example, a silicon oxide film is buried inside the device isolation groove 3.

An n-channel MIS transistor Qn is formed in the p-type well 2P. The n-channel MIS transistor Qn is formed in an active region defined by the device isolation groove 3 and includes a source region ns and a drain region nd formed in the p-type well 2P, and a gate electrode ng formed on the p-type well 2P via a gate insulator ni. In addition, a p-type MIS transistor Qp is formed in the n-type well 2N. The p-channel MIS transistor Qp includes a source region ps and a drain region pd formed in the n-type well 2N, and a gate electrode pg formed on the n-type well 2N via a gate insulator pi.

Wirings made of a metal film for connecting the n-channel MIS transistor Qn and the p-channel MIS transistor Qp are formed on an upper part of these semiconductor elements. While the wirings for connecting semiconductor elements have a multi-layer wiring structure of about three to ten layers generally, FIG. 7 illustrates two layers of wiring layers (a first layer Cu wiring 7 and a second layer Cu wiring 9) constituted by metal films mainly composed of copper alloy, and one layer of wiring layer (a third layer Al wiring 11) constituted by a metal film mainly composed of aluminum (Al) alloy as an example of multi-layer wiring. The word "wiring layer" is used to collectively indicate the plurality of wirings formed in each wiring layer.

Insulating films 5, 8 and 10 each made of a silicon oxide film or the like and plugs p1, p2 and p3 for electrically connecting the three layers of wirings are respectively formed between the first layer Cu wiring 7 and the n-channel MIS transistor Qn along with the p-channel MIS transistor Qp, between the first layer Cu wiring 7 and the second layer Cu wiring 9, and between the second layer Cu wiring 9 and the third layer Al wiring 11. The insulating film 6 electrically separates a plurality of the first layer Cu wirings 7 and is made of, for example, a silicon oxide film.

The insulating film 5 is formed over the semiconductor substrate 1a so as to cover, for example, the semiconductor elements, and the first layer Cu wiring 7 is formed in the insulating film 6 on the insulating film 5. The first layer Cu wiring 7 is electrically connected to the source region ns, drain region nd, and gate electrode ng of the n-channel MIS transistor Qn that is a semiconductor element, via, for example, a plug p1 formed in the insulating film 5. In addition, the first layer Cu wiring 7 is electrically connected to the source region ps, drain region pd, and gate electrode pg of the p-channel MIS transistor Qp that is a semiconductor element via the plug p1 formed in the insulating film 5. Connections of the gate electrodes ng and pg and the first layer Cu wiring 7 are not illustrated. The plugs p1, p2 and p3 are each constituted by, for example, a W (tungsten) film. The first layer Cu wiring 7 is formed into a wiring groove of the insulating film 6 by a damascene method and is constituted by a stacked-layer structure of a barrier conductive film and a conductive film mainly composed of copper at an upper layer of the barrier conductive film. The barrier conductive film is made of tantalum (Ta), titanium (Ti), ruthenium (Ru), tungsten (W), manganese (Mn), and a nitride or a silicon nitride of these elements, or a stacked-layer film of these elements. The conductive film mainly composed of copper is made of copper (Cu) or a copper alloy (of copper (Cu) and aluminum (Al), magnesium (Mg), titanium (Ti), manganese (Mn), iron (Fe), zinc (Zn), zirconium (Zr), niobium (Nb), molybdenum (Mo), ruthenium (Ru), palladium (Pd), silver (Ag), gold (Au), indium (In), a lanthanoid-based metal, an actinoid-based metal or the like).

The second layer Cu wiring 9 is electrically connected to the first layer Cu wiring 7 via the plug p2 formed in, for example, the insulating film 8. The third layer Al wiring 11 is electrically connected to the second layer Cu wiring 9 via the plug p3 formed in, for example, the insulating film 10a. The plug p3 is constituted by a metal film such as a W (tungsten) film.

The second layer Cu wiring 9 is formed in the insulating film 8 integrally with the plug p2, and the second layer Cu wiring 9 and the plug p2 are constituted by a stacked-layer structure of a barrier conductive film and a conductive film mainly composed of copper at an upper layer of the barrier conductive film. In addition, the barrier conductive film and the conductive film mainly composed of copper are made of materials same as those of the first layer Cu wiring 7.

In addition, a barrier insulating film for preventing diffusion of copper into the insulating film 8 or 10a is preferably formed between the first layer Cu wiring 7 and the insulating film 8 and between the second layer Cu wiring 9 and the insulating film 10a. A SiCN film or a stacked-layer of a SiCN film and a SiCO film may be used as the barrier film.

Further, the third layer Al wiring 11 is made of an aluminum alloy film (for example, an Al film added with Si and Cu), but it may be a Cu wiring.

Moreover, while the insulating film 5 is made of a silicon oxide film (SiO$_2$ film), it is needless to say that the insulating film 5 may be constituted by a single layer of or stacked layers of a silicon oxide film containing carbon (SiOC film), a silicon oxide film containing nitride and carbon (SiCON film), and a silicon oxide film containing fluorine (SiOF film).

A surface protection film 12a and a protection film 13a are formed in this order over an upper part of the third Al wiring 11 that is a topmost wiring layer of the multi-layer wiring. In addition, the third Al wiring 11 that is the topmost wiring layer being exposed through a bottom portion of an opening (pad opening) formed in the surface protection film 12a and the protection film 13a configure a pad electrode (pad, electrode pad) PAa. Further, the third Al wiring 11 configures the inductor element L1 in the inductor region LR1. The inductor element is covered by the surface protection film 12a and the protection film 13a.

The surface protection film 12a is an inorganic insulating film constituted by a stacked film of, for example, a silicon oxide film and a silicon nitride film formed over the silicon oxide film, and has a thickness of 1 to 3 μm. The protection film 13a is an organic film of, for example, a polyimide film or the like, and has a thickness of 5 to 10 μm.

While the sectional structure of the semiconductor chip CHa has been described above, the semiconductor chip CHb and the semiconductor chip CHc have the same sectional structures. In FIG. 8 to be described later, components of the semiconductor chip CHb corresponding to the main surface PSa, a rear surface RSa, the semiconductor substrate 1a, the insulating film 10a, the surface protection film 12a and the protection film 13a of the semiconductor chip CHa will be respectively referred to as a main surface PSb, a rear surface RSb, the semiconductor substrate 1b, the insulating film 10b, the surface protection film 12b and the protection film 13b. In the same manner, in FIG. 9 to be described later, components of the semiconductor chip CHc corresponding to the main surface PSa, the rear surface RSa, the semiconductor substrate 1a, the insulating film 10a, the surface protection film 12a and the protection film 13a of the semiconductor chip CHa will be respectively referred to as a main surface PSc, a rear surface RSc, a semiconductor substrate 1c, the insulating film 10c, a surface protection film 12c and a protection film 13c.

Next, as illustrated in FIGS. 3, 8 and 9, the semiconductor device SD includes the semiconductor chips CHa, CHb and CHc, and a plurality of external terminals Ta, Tb, TC and TNC. The semiconductor chips CHa, CHb and CHc are sealed in the sealing body BD. In addition, a part of each of external terminals Ta, Tb, Tc and TNC are sealed in the sealing body BD. The sealing body BD is rectangular and has an upper surface BDa, a lower surface BDb, and four side surfaces BDs1, BDs2, BDs3 and BDs4. As illustrated in FIG. 3, the side surfaces BDs1 and BDs2 are opposite to each other in the X direction, and the side surfaces BDs3 and BDs4 are opposite to each other in the Y direction. The plurality of external terminals Ta is arranged on the side surface BDs1, the plurality of external terminals Tb, Tc and TNC are arranged on the side surface BDs2, and no external terminal is arranged on the side surfaces BDs3 and BDs4. The plurality of external terminals Ta are connected to the pad electrodes PAa of the semiconductor chip CHa by wires W, the plurality of external terminals Tb are connected to the pad electrodes PAb of the semiconductor chip CHb by wires W, and the plurality of external terminals Tc are connected to the pad electrodes PAc of the semiconductor chip CHc by wires W. The external terminal TNC not connected to the semiconductor chips CHa, CHb and CHc are arranged between the plurality of external terminals Tb and the plurality of external terminals Tc.

As illustrated in FIGS. 3 and 8, the semiconductor chip CHb is arranged on the semiconductor chip CHa so that a partial region of the semiconductor chip CHb overlaps a partial region of the semiconductor chip CHa. The semiconductor chips CHb and CHc are stacked so that the main surface PSa and the main surface PSb face each other with an insulative adhesion layer (insulative adhesion sheet) DAF1 interposed therebetween. The inductor region LR1 (in other words, the inductor element L1) of the semiconductor chip CHa and the inductor region LR3 (in other words, the inductor element L3) of the semiconductor chip CHb overlap each other so that they almost match up in the X direction and Y direction in FIG. 3. Of course, the inductor regions LR1 and LR3 are configured so as to have the same size in the X direction and Y direction. A size of the insulative adhesion layer DAF1 is larger than those of the inductor regions LR1 and LR3 in the X direction and the Y direction, and the whole area of the inductor regions LR1 and LR3 is covered by the insulative adhesion layer DAF1. Note that the pad electrode PAa of the semiconductor chip CHa and the pad electrode PAb of the semiconductor chip CHb are arranged in a region in which the semiconductor chips CHa and CHb do not overlap each other. In other words, the pad electrode PAa of the semiconductor chip CHa and the pad electrode PAb of the semiconductor chip CHb are not covered by the insulative adhesion layer DAF1 but are exposed from the insulative adhesion layer DAF1. Note that the semiconductor chip CHa is mounted on a die pad DP via an adhesion layer AD.

As illustrated in FIGS. 3 and 9, the semiconductor chip CHc is arranged on the semiconductor chip CHa so that a partial region of the semiconductor chip CHc overlaps a partial region of the semiconductor chip CHa. The semiconductor chips CHa and CHc are stacked so that the main surface PSa and the main surface PSc face each other with an insulative adhesion layer (insulative adhesion sheet) DAF2 interposed therebetween. The inductor region LR2 (in other words, the inductor element L2) of the semiconductor chip CHa and the inductor region LR4 (in other words, the inductor element L4) of the semiconductor chip CHb overlap each other so that they almost match up in the X direction and Y direction in FIG. 3. Of course, the inductor regions LR2 and LR4 are configured so as to have the same size in the X direction and Y direction. A size of the insulative adhesion layer DAF2 is larger than those of the inductor regions LR2 and LR4 in the X direction and the Y direction, and the whole area of the inductor regions LR2 and LR4 is covered by the insulative adhesion layer DAF2. Note that the pad electrode PAa of the semiconductor chip CHa and the pad electrode PAc of the semiconductor chip CHc are arranged in a region in which the semiconductor chips CHa and CHc do not overlap each other. In other words, the pad electrode PAa of the semiconductor chip CHa and the pad electrode PAc of the semiconductor chip CHc are not covered by the insulative adhesion layer DAF2 but are exposed from the insulative adhesion layer DAF2.

Next, a sectional structure in the Y direction of the semiconductor device SD according to the present embodiment will be described with reference to FIG. 10. Note that, in FIG. 10, the die pad DP and the adhesion layer AD are omitted. As illustrated in FIG. 10, the semiconductor chip CHb is mounted on the semiconductor chip CHa via the insulative adhesion layer DAF1. The main surface PSa of the semiconductor chip CHa and the main surface PSb of the semiconductor chip CHb face each other. In addition, the inductor region LR1 of the semiconductor chip CHa and the inductor region LR3 of the semiconductor chip CHb overlap each other. In other words, the inductor element L1 of the semiconductor chip CHa and the inductor element L3 of the semiconductor chip CHb overlap each other.

Further, the semiconductor chip CHc is mounted on the semiconductor chip CHa via the insulative adhesion layer DAF2. The main surface PSa of the semiconductor chip CHa and the main surface PSc of the semiconductor chip CHc face each other. In addition, the inductor region LR1 of the semiconductor chip CHa and the inductor region LR4 of the semiconductor chip CHc overlap each other. In other words, the inductor element L2 of the semiconductor chip CHa and the inductor element L4 of the semiconductor chip CHc overlap each other.

Here, the insulative adhesion layers DAF1 and DAF2 are thermo-setting or thermoreversible insulating films mainly composed of, for example, epoxy resin, acryl resin, or a resin mixture of these components. In addition, a thickness T(DAF1) and a thickness T(DAF2) of the insulative adhesion layers DAF1 and DAF2 may be, for example, greater than or equal to 10 μm and less than or equal to 100 μm.

As illustrated in FIG. 3, a distance of the closest part between the semiconductor chip CHb and the semiconductor chip CHc in plan view is referred to as a separation distance Dbc. In addition, a withstand voltage between the semiconductor chip CHb and the semiconductor chip CHc depends on a creepage distance. Creepage distance is a distance along a surface of an insulator that is present between the semiconductor chip CHb and the semiconductor chip CHc. That is, an interface distance between the sealing body BD and the insulator in contact with the sealing body BD becomes a problem. This is because a leakage current tends to occur at the interface between the sealing body BD and the insulator.

In other words, according to the present embodiment, as illustrated in FIG. 10, a creepage distance CD1 between the semiconductor chip CHb and the semiconductor chip CHc is a sum of a length of an interface between the sealing body BD and the insulative adhesion layers DAF1 and DAF2 and a length of an interface between the sealing body BD and the protection film 13a that are present between the semiconductor chip CHb and the semiconductor chip CHc. Therefore, as the insulative adhesion layers DAF1 and DAF2 are divided, the creepage distance CD1 between the semiconductor chip CHb and the semiconductor chip CHc can be increased by the thickness T(DAF1) and thickness T(DAF2) of the insulative adhesion layers DAF1 and DAF2 as compared to the separation distance Dbc between the semiconductor chip CHb and the semiconductor chip CHc. In other words, the following relation is established: creepage distance CD1=separation distance Dbc+thickness T(DAF1)+ thickness T(DAF2). Since the separation distance can be decreased by the increased amount of the creepage distance, downsizing of the semiconductor device SD in the Y direction can be achieved.

Also, a separation distance d between the insulative adhesion layers DAF1 and DAF2 is smaller than the separation distance Dbc between the semiconductor chips CHb and CHc in the Y direction. An end portion of the insulative adhesion layer DAF1 protrudes from an end portion of the semiconductor chip CHb, and an end portion of the insulative adhesion layer DAF2 protrudes from an end portion of the semiconductor chip CHc. Therefore, it is possible to make the creepage distance CD1 between the semiconductor chip CHb and the semiconductor chip CHc larger than the separation distance Dbc as described above while ensuring a withstand voltage between the semiconductor chip CHa and the semiconductor chip CHb and a withstand voltage between the semiconductor chip CHa and the semiconductor chip CHc.

Further, at an end portion of the semiconductor chip CHa in the Y direction, an end portion of the insulative adhesion layer DAF1 protrudes from end portions of the semiconductor chips CHa and CHb, and an end portion of the insulative adhesion layer DAF2 protrudes from end portions of the semiconductor chips CHa and CHc. Thus, the creepage distance between the semiconductor chips CHa and CHb and the creepage distance between the semiconductor chips CHa and CHc can be increased.

<Method of Manufacturing Semiconductor Device>

Figure 11:
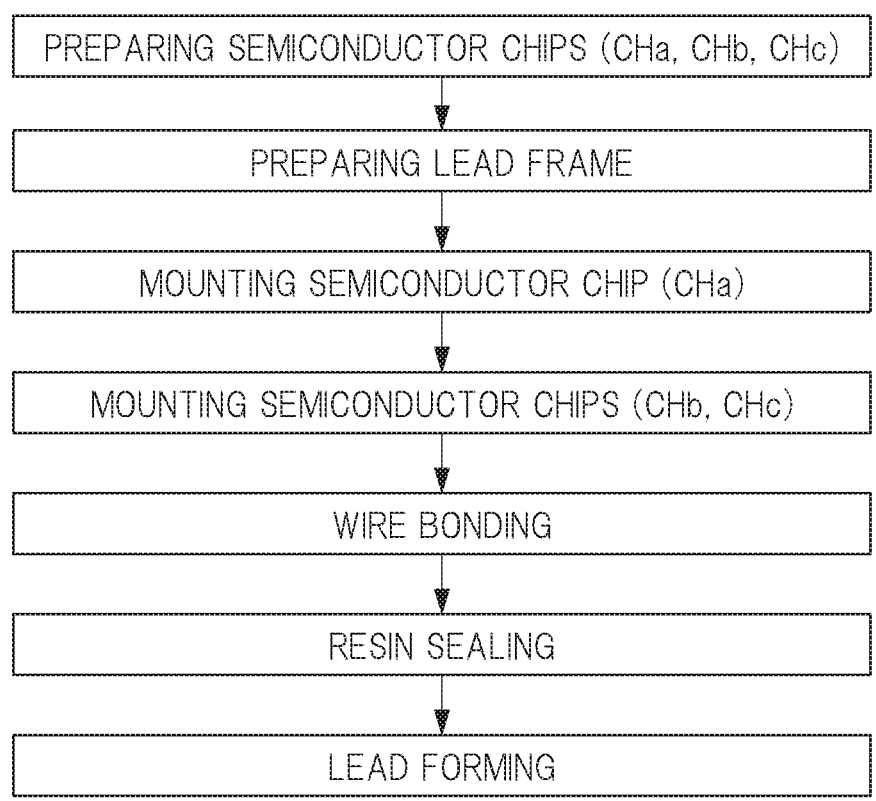
FIG. 11 is a process flowchart illustrating a manufacturing process of the semiconductor device of the present embodiment.
Figure 12:
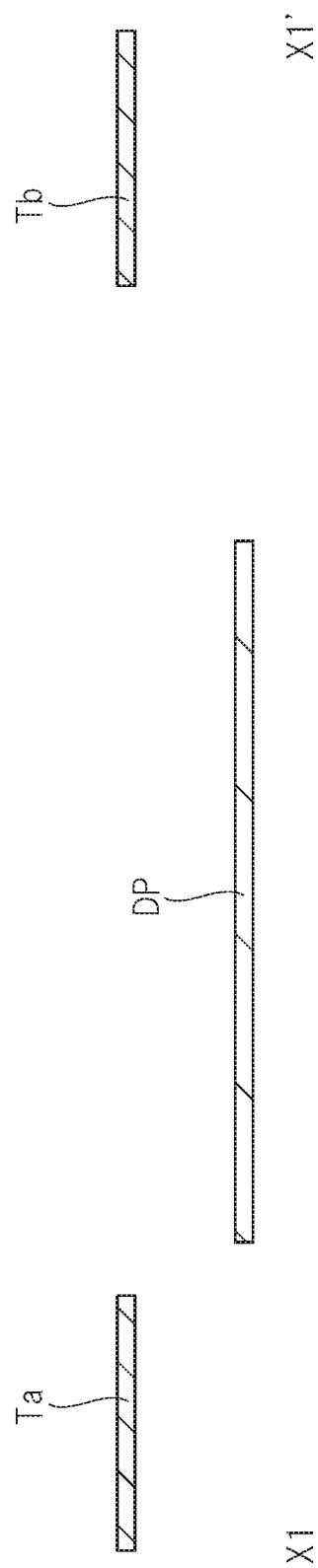
FIG. 12 is a cross-sectional view of main parts of the semiconductor device of the present embodiment during the manufacturing process.
Figure 13:
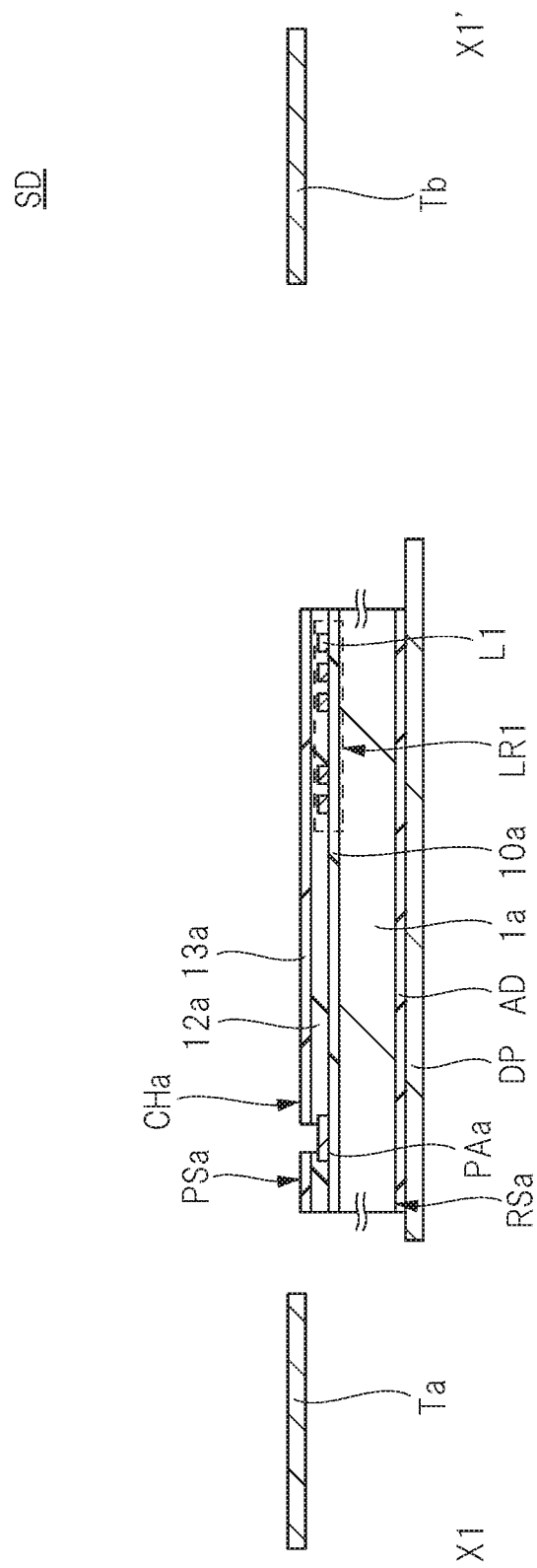
FIG. 13 is a cross-sectional view of main parts of the semiconductor device of the present embodiment during the manufacturing process continued from FIG. 12.
Figure 14:
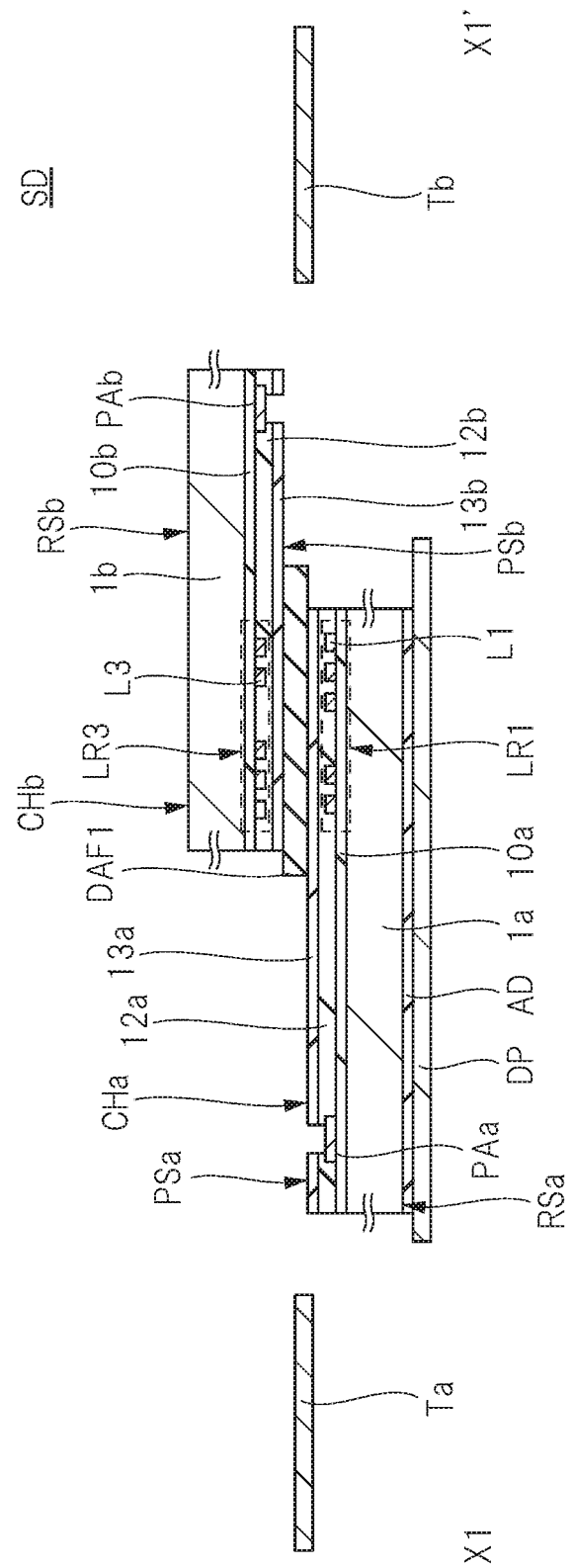
FIG. 14 is a cross-sectional view of main parts of the semiconductor device of the present embodiment during the manufacturing process continued from FIG. 13.
Figure 15:
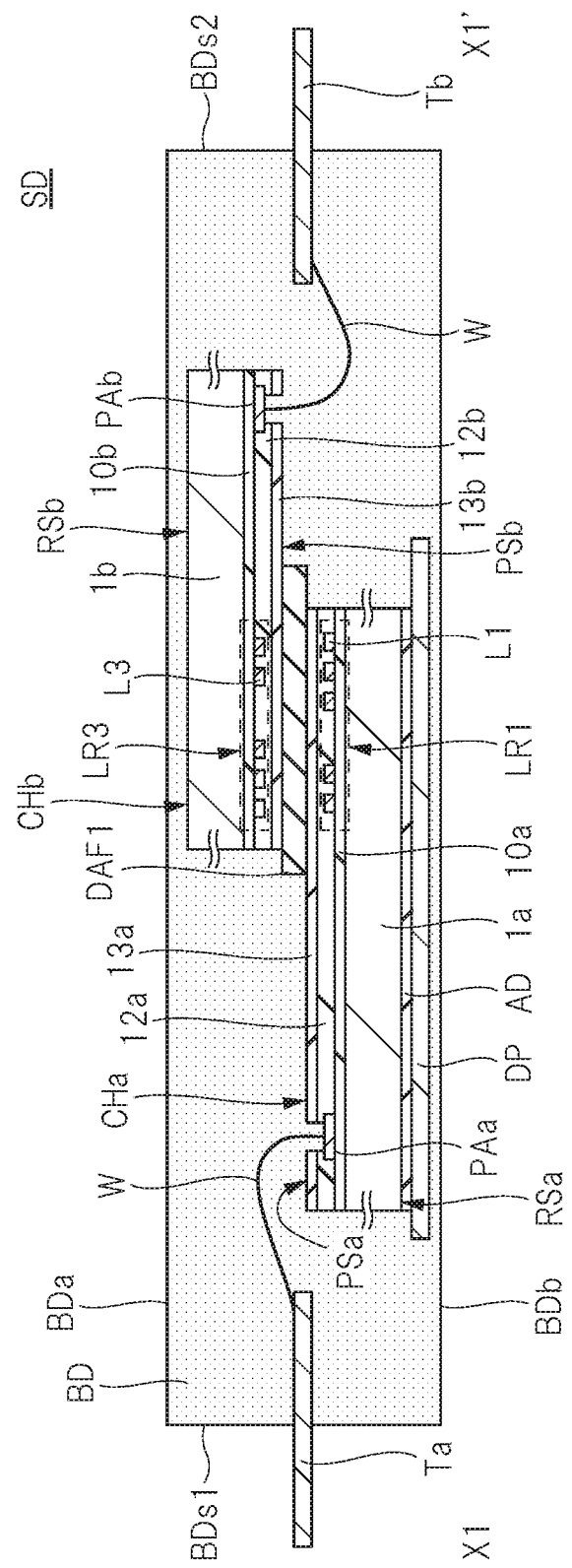
FIG. 15 is a cross-sectional view of main parts of the semiconductor device of the present embodiment during the manufacturing process continued from FIG. 14.

FIG. 11 is a process flowchart illustrating a manufacturing process of the semiconductor device of the present embodiment. FIG. 12 is a cross-sectional view of main parts of the semiconductor device of the present embodiment during the manufacturing process, FIG. 13 is a cross-sectional view of main parts of the semiconductor device of the present embodiment during the manufacturing process continued from FIG. 12, FIG. 14 is a cross-sectional view of main parts of the semiconductor device of the present embodiment during the manufacturing process continued from FIG. 13, and FIG. 15 is a cross-sectional view of main parts of the semiconductor device of the present embodiment during the manufacturing process continued from FIG. 14. FIGS. 12 to 15 correspond to the section taken along line X-X' in FIG. 3.

First, a step of preparing the semiconductor chips CHa, CHb and CHc illustrated in FIG. 11 is performed. The semiconductor chips CHa, CHb and CHc described with reference to FIGS. 4 to 6 are prepared.

Next, a step of preparing a lead frame illustrated in FIG. 11 is performed. As illustrated in FIG. 12, the external terminals Ta and Tb and a lead frame having the die pads DP are prepared. Although not illustrated in FIG. 12, the lead frame also includes the external terminals Tc and TNC illustrated in FIG. 3. A large number of regions for forming the semiconductor device SD described above are provided on the lead frame. Note that the step of preparing the semiconductor chips CHa, CHb and CHc and the step of preparing the lead frame can be performed in any order or can be performed at the same time.

Next, a step of mounting the semiconductor chip CHa illustrated in FIG. 11 is performed. As illustrated in FIG. 13, the semiconductor chip CHa is mounted on the die pad DP via the adhesion layer AD. The rear surface RSa of the semiconductor chip CHa is adhered to the die pad DP.

Next, a step of mounting the semiconductor chips CHb and CHc illustrated in FIG. 11 is performed. As illustrated in FIG. 14, the semiconductor chip CHb is mounted on the semiconductor chip CHa via the insulative adhesion layer DAF1. Note that, although not illustrated in FIG. 14, the semiconductor chip CHc is mounted on the semiconductor chip CHa via the insulative adhesion layer DAF2. As described above, the main surface PSa of the semiconductor chip CHa and the main surface PSb of the semiconductor chip CHb are made to face each other. In the same manner, as described with reference to FIG. 9, the main surface PSa of the semiconductor chip CHa and the main surface PSc of the semiconductor chip CHc are made to face each other.

Next, a step of wire bonding and a step of resin sealing illustrated in FIG. 11 are performed. As illustrated in FIG. 15, the pad electrode PAa of the semiconductor chip CHa and the external terminal Ta are connected by the wire W. Further, the pad electrode PAb of the semiconductor chip CHb and the external terminal Tb are connected by the wire W. Although not illustrated, in the same manner, the pad electrode PAc of the semiconductor chip CHc and the external terminal Tc are connected by the wire W. Next, parts of the semiconductor chips CHa, CHb and CHc, the die pad DP, the external terminals Ta and Tb, and the external terminals Tc and TNC (not illustrated) are sealed by resin to form the sealing body BD. The sealing body BD is made of an epoxy resin containing, for example, a filler of silicon oxide in globular shape or the like.

Next, a step of forming leads illustrated in FIG. 11 is performed. As illustrated in FIGS. 8 and 9, the external terminals Ta, Tb and Tc exposed from the side surfaces BDs1 and BDs2 of the sealing body BD are bent toward the lower surface BDb of the sealing body BD. In this manner, the semiconductor device SD of the present embodiment is completed. Note that the external terminal TNC is also formed in the same manner.

<First Modification Example>

Figure 16:
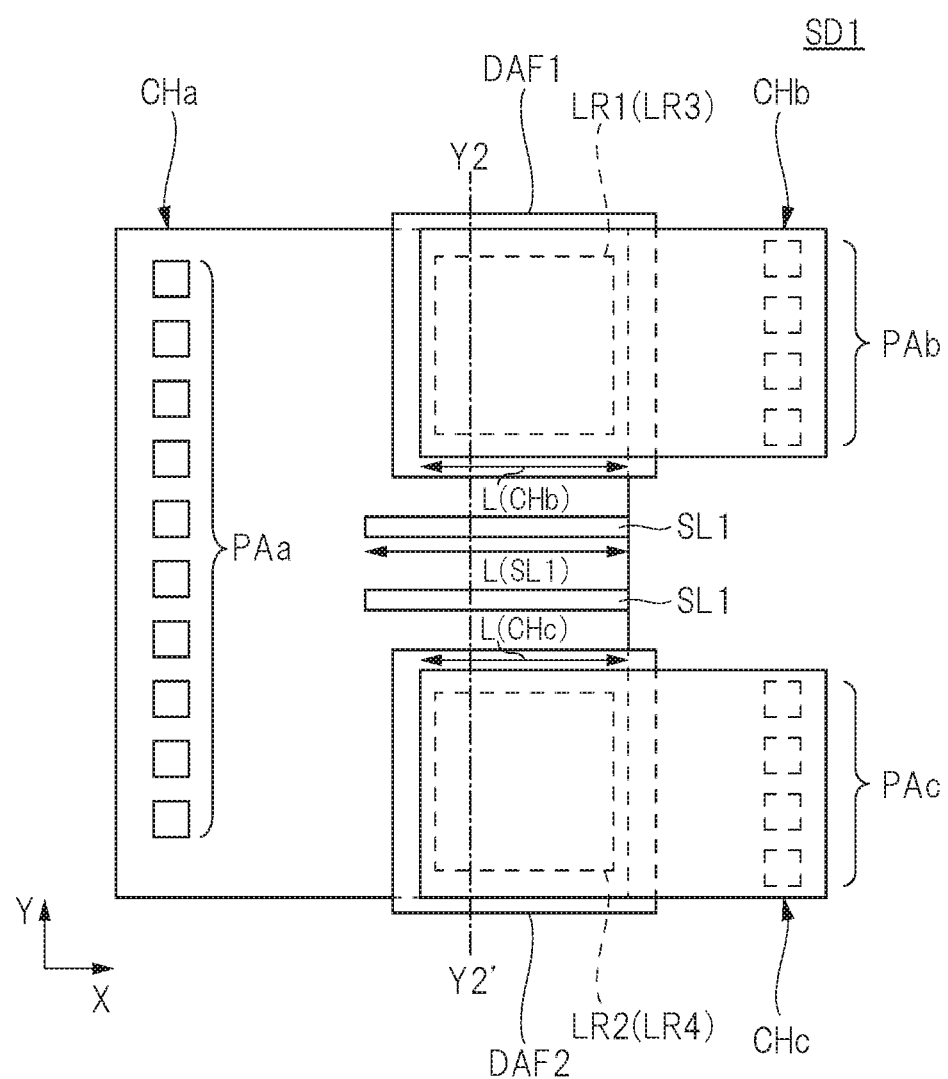
FIG. 16 is a plan view of a semiconductor device according to a first modification example.
Figure 17:
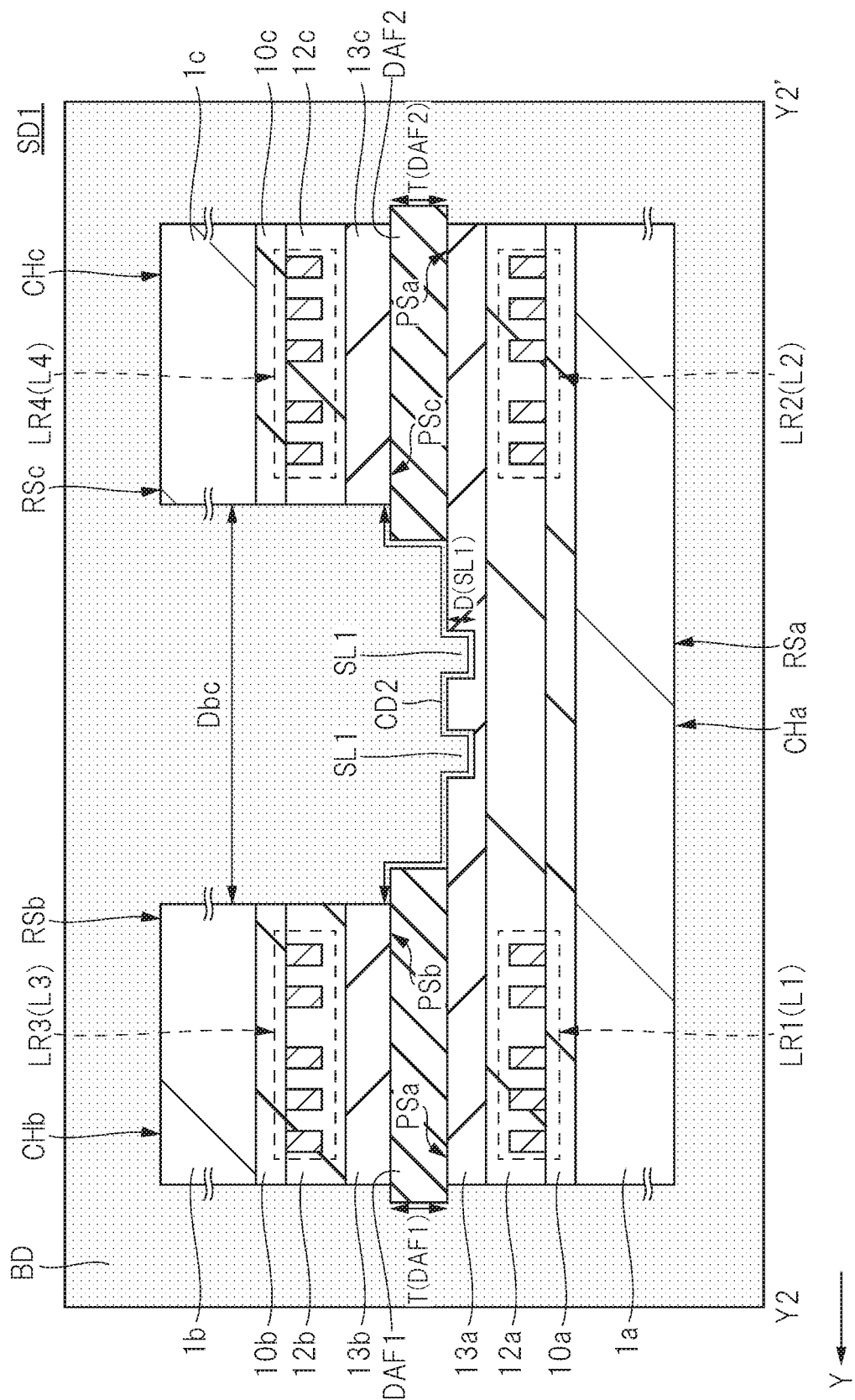
FIG. 17 is a cross-sectional view of main parts taken along line Y2-Y2' in FIG. 16.

FIG. 16 is a plan view of a semiconductor device according to a first modification example, and FIG. 17 is a cross-sectional view of main parts taken along line Y2-Y2' in FIG. 16. In a semiconductor device SD1 of the first modification example, a slit SL1 is provided in the protection film 13a of the semiconductor chip CHa between the insulative adhesion layers DAF1 and DAF2. The same components as the embodiment described above are denoted by the same symbols.

As illustrated in FIG. 16, the two slits SL1 are provided in the main surface PSa of the semiconductor chip CHa between the insulative adhesion layers DAF1 and DAF2. Note that the number of the slits SL1 can be one or three or more. As illustrated in FIG. 17, the slit SL1 has a depth D(SL1).

By providing the two slits SL1 in the protection film 13a between the insulative adhesion layers DAF1 and DAF2 as illustrated in FIGS. 16 and 17, the creepage distance CD2 between the semiconductor chips CHb and CHc can be increased by 4×D(SL1) as compared to the embodiment described above. Therefore, downsizing of the semiconductor device SD1 can be achieved.

The slit SL1 extends in the X direction. Here, the X direction is a direction that is orthogonal to the direction in which the plurality of pad electrodes PAa provided on the semiconductor chip CHa are aligned. A length L(SL1) of the slit SL1 in the X direction is preferably longer than a distance L(CHb) of the region in which the semiconductor chip CHa and the semiconductor chip CHb overlap each other and a distance L(CHc) of the region in which the semiconductor chip CHa and the semiconductor chip CHc overlap each other.

The slit SL1 may reach the surface protection film 12a because the deeper the slit SL1 is, the larger the creepage distance CD2 can be. However, as illustrated in FIG. 17, when the depth of the slit SL1 is smaller than a thickness of the protection film 13a, whereby the film protection film 13a is interposed between the sealing body BD and the surface protection film 12a in the slit SL1, it is possible to reduce a risk of cracking in the surface protection film 12a caused by the filler in the sealing body BD scratching the surface protection film 12a.

Note that the slit SL1 is formed in the semiconductor chip CHa in the step of preparing the semiconductor chips CHa, CHb and CHc in the process flow of the embodiment described above. For example, in FIG. 7 of the embodiment described above, after depositing the protection film 13a over the surface protection film 12a, the slit SL1 can be formed by using an optical exposure method or a nano-printing method. Further, when the thickness of the protection film 13a is, for example, 10 μm, the depth D(SL1) of the slit SL1 can be set to 7 μm.

\<Second Modification Example\>

Figure 18:
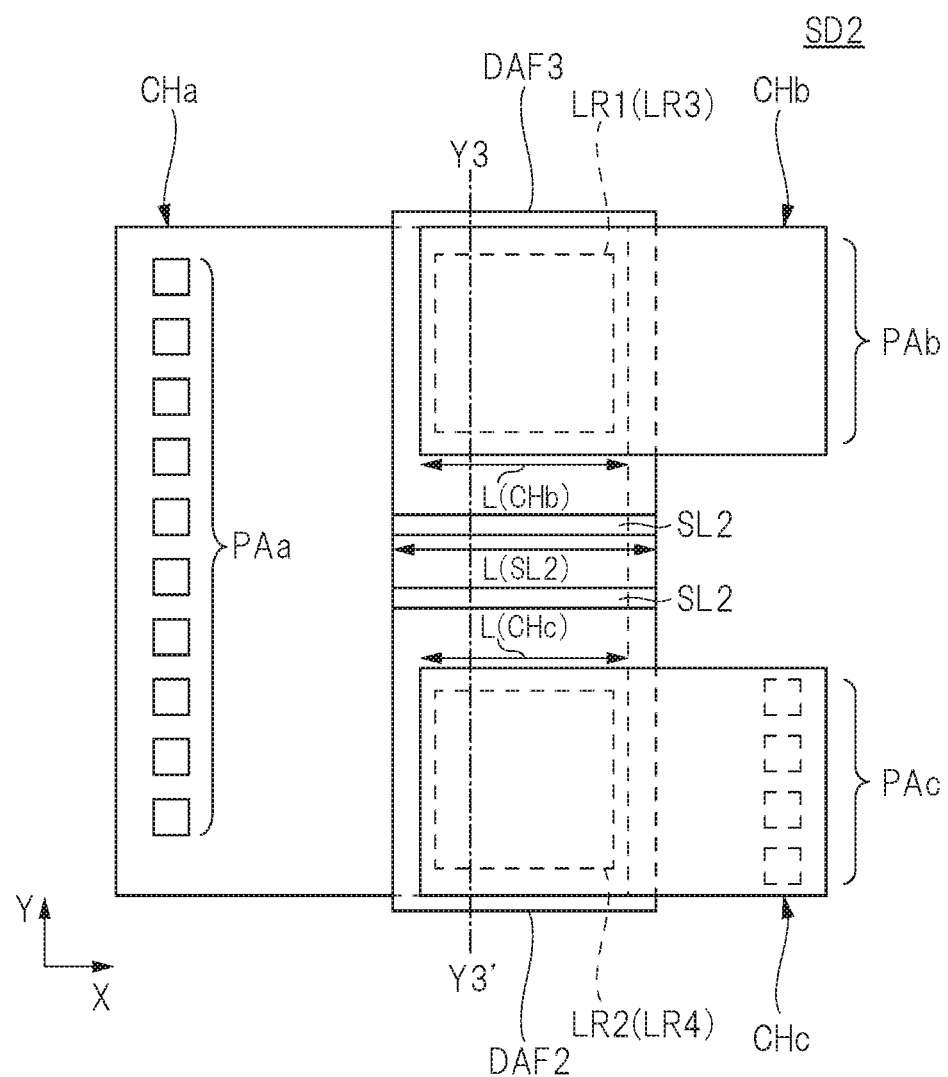
FIG. 18 is a plan view of a semiconductor device according to a second modification example.
Figure 19:
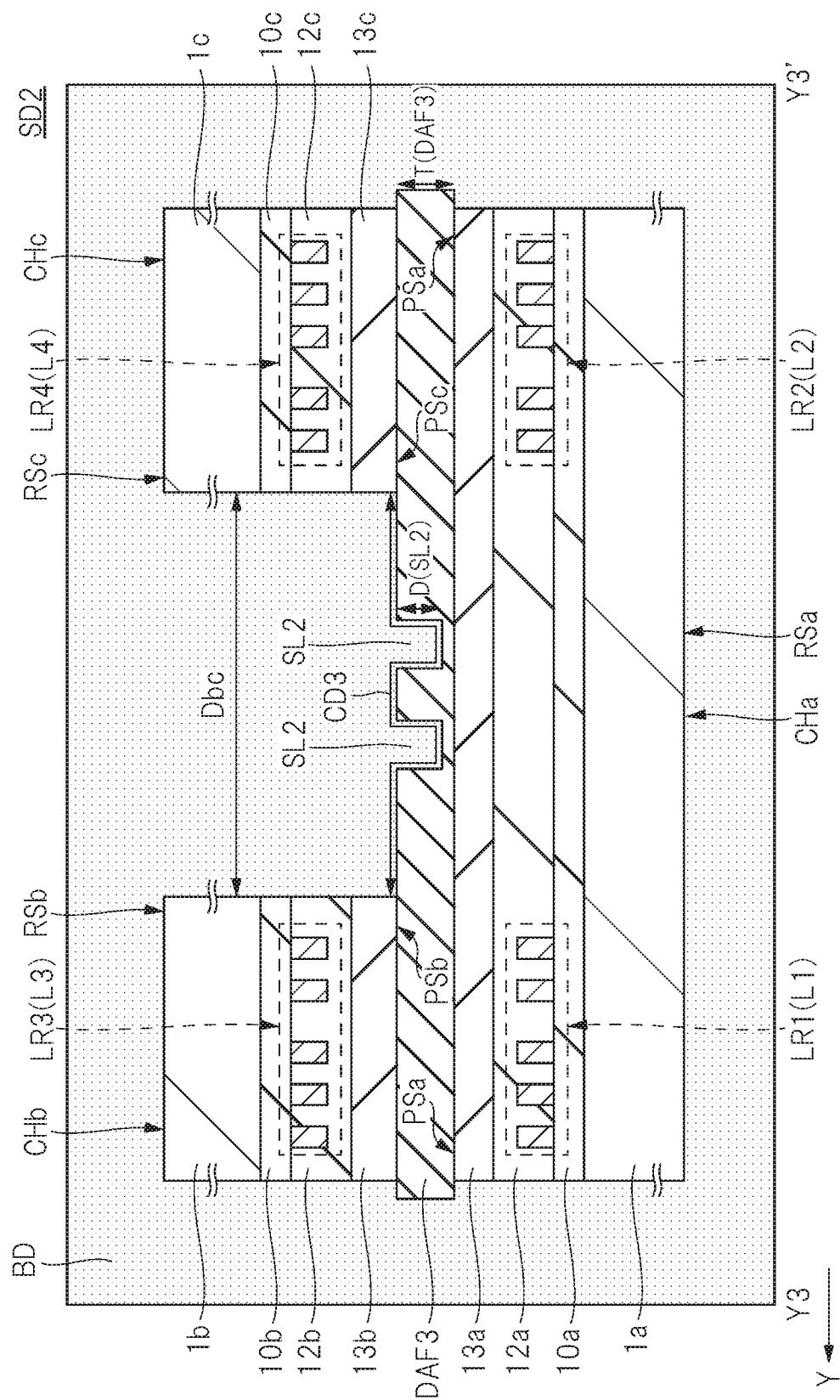
FIG. 19 is a cross-sectional view of main parts taken along line Y3-Y3' in FIG. 18.

FIG. 18 is a plan view of a semiconductor device according to a second modification example, and FIG. 19 is a cross-sectional view of main parts taken along line Y3-Y3' in FIG. 18. In a semiconductor device SD2 of the second modification example, the semiconductor chips CHb and CHc are adhered to the semiconductor chip CHa by one insulative adhesion layer DAF3. A slit SL2 is provided in the insulative adhesion layer DAF3 between the semiconductor chips CHb and CHc. The same components as the embodiment described above are denoted by the same symbols.

As illustrated in FIGS. 18 and 19, the insulative adhesion layer DAF3 has a configuration in which the two insulative adhesion layers DAF1 and DAF2 of the embodiment described above are joined in the Y direction. In other words, the whole area of the inductor regions LR1 and LR3 and the whole area of the inductor regions LR2 and LR4 in the X direction and Y direction are covered by the insulative adhesion layer DAF3. In addition, two slits SL2 are provided in the insulative adhesion layer DAF3 between the semiconductor chips CHb and CHc. Note that the number of the slit SL2 may be one or three or more. As illustrated in FIG. 19, a depth D(SL2) of the slit SL2 is smaller than a thickness T(DAF3) of the insulative adhesion layer DAF3.

By providing the two slits SL2 in the insulative adhesion layer DAF3 between the semiconductor chips CHb and CHc, a creepage distance CD3 can be substantially the same as the creepage distance CD1 of the embodiment described above. Therefore, downsizing of the semiconductor device SD2 can be achieved. To be more precise, the creepage distance CD3 is slightly smaller than the creepage distance CD1. However, since the semiconductor chips CHb and CHc can be adhered to the semiconductor chip CHa by one insulative adhesion layer DAF3, the manufacturing process can be simplified.

Note that, in the method of manufacturing the semiconductor device SD2 of the second modification example, the insulative adhesion layer DAF3 having the slit SL2 is adhered onto the semiconductor chip CHa, and the semiconductor chips CHb and CHc can be adhered thereon. Further, after mounting the semiconductor chips CHb and CHc on the semiconductor chip CHa, the insulative adhesion layer DAF3 without the slit SL2 can be used to form the slit SL2 by laser processing.

In addition, a length L(SL2) of the slit SL2 in the X direction is preferably longer than the distance L(CHb) of the region in which the semiconductor chip CHa and the semiconductor chip CHb overlap each other and the distance L(CHc) of the region in which the semiconductor chip CHa and the semiconductor chip CHc overlap each other. In the second modification example, the slit SL2 is provided across the whole area of the inductive adhesion layer DAF3 in the X direction.

Note that, when the length of the slit SL2 in the X direction is made to be smaller than the insulative adhesion layer DAF3, the depth of the slip SL2 may be set to be the same as the thickness T(DAF3) of the insulative adhesion layer DAF3.

\<Third Modification Example\>

Figure 20:
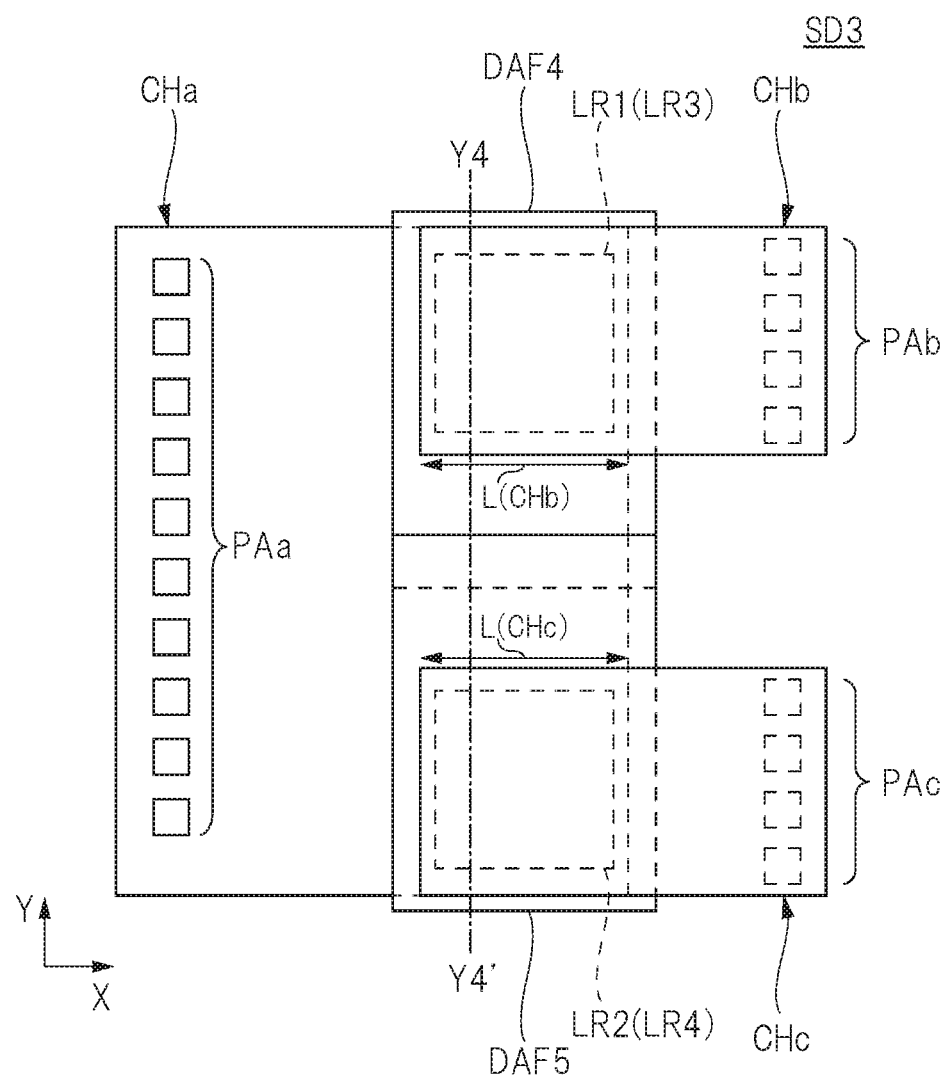
FIG. 20 is a plan view of a semiconductor device according to a third modification example.
Figure 21:
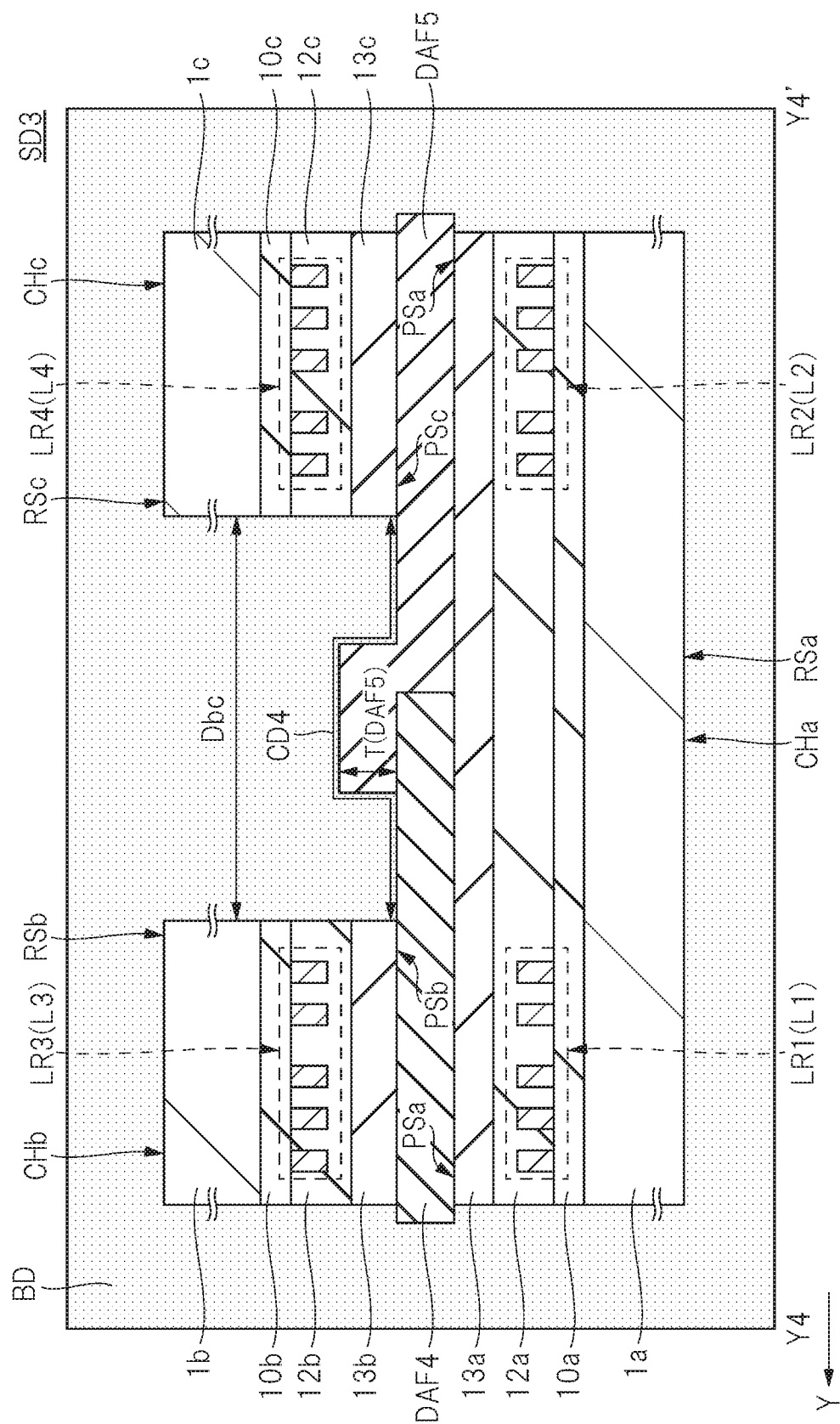
FIG. 21 is a cross-sectional view of main parts taken along line Y4-Y4' in FIG. 20.

FIG. 20 is a plan view of a semiconductor device according to a third modification example, and FIG. 21 is a cross-sectional view of main parts taken along line Y4-Y4' in FIG. 20. In a semiconductor device SD3 of the third modification example, an insulative adhesion layer DAF5 overlaps an insulative adhesion layer DAF4 between the semiconductor chips CHb and CHc. The same components as the embodiment described above are denoted by the same symbols.

As illustrated in FIGS. 20 and 21, the semiconductor chip CHb is mounted on the semiconductor chip CHa via the insulative adhesion layer DAF4, and the semiconductor chip CHc is mounted on the semiconductor chip CHa via the insulative adhesion layer DAF5. In addition, the insulative adhesion layer DAF5 is on top of the insulative adhesion layer DAF4 between the semiconductor chips CHb and CHc.

By providing an overlapped region of the insulative adhesion layers DAF4 and DAF5 between the semiconductor chips CHb and CHc, a creepage distance CD4 can become twice a thickness T(DAF5) of the insulative adhesion layer DAF5 as compared to the separation distance Dbc. Therefore, downsizing of the semiconductor device SD3 can be achieved.

Note that the insulative adhesion layer DAF4 between the semiconductor chips CHb and CHc may be on top of the insulative adhesion layer DAF5.

\<Fourth Modification Example\>

Figure 22:
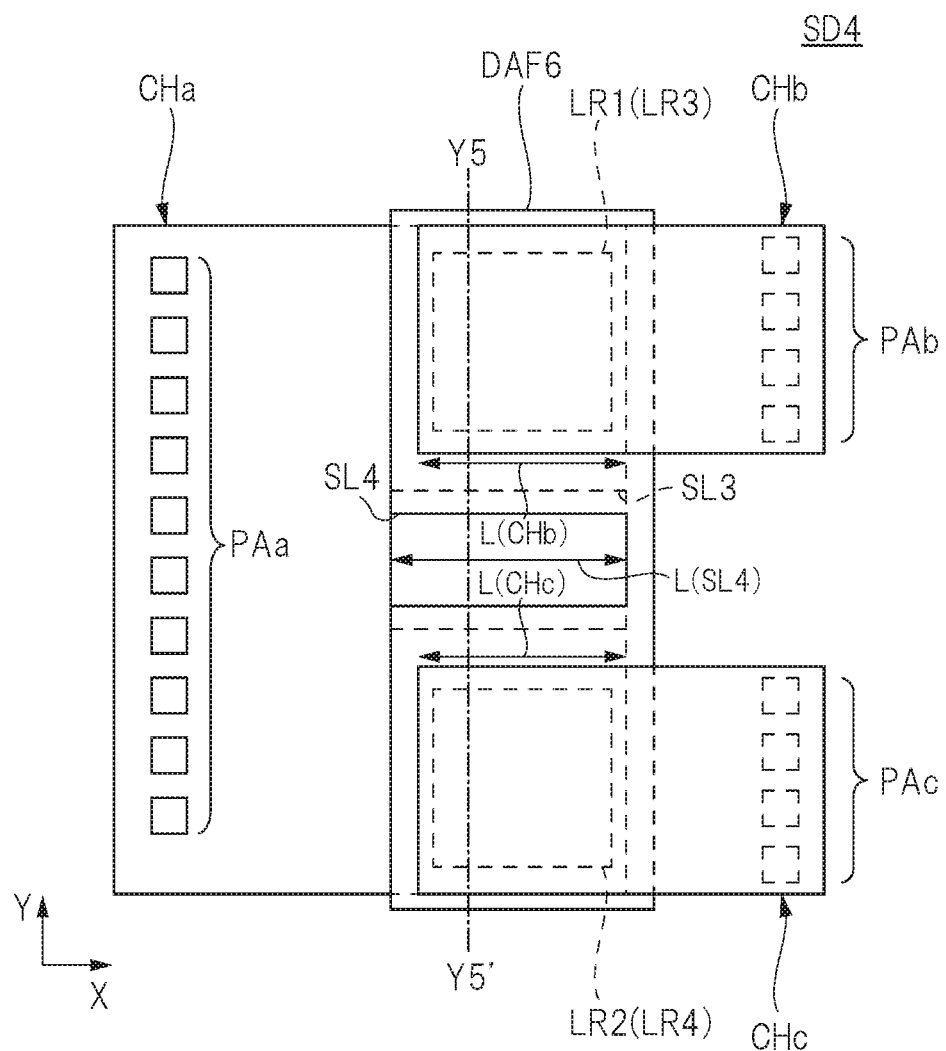
FIG. 22 is a plan view of a semiconductor device according to a fourth modification example.
Figure 23:
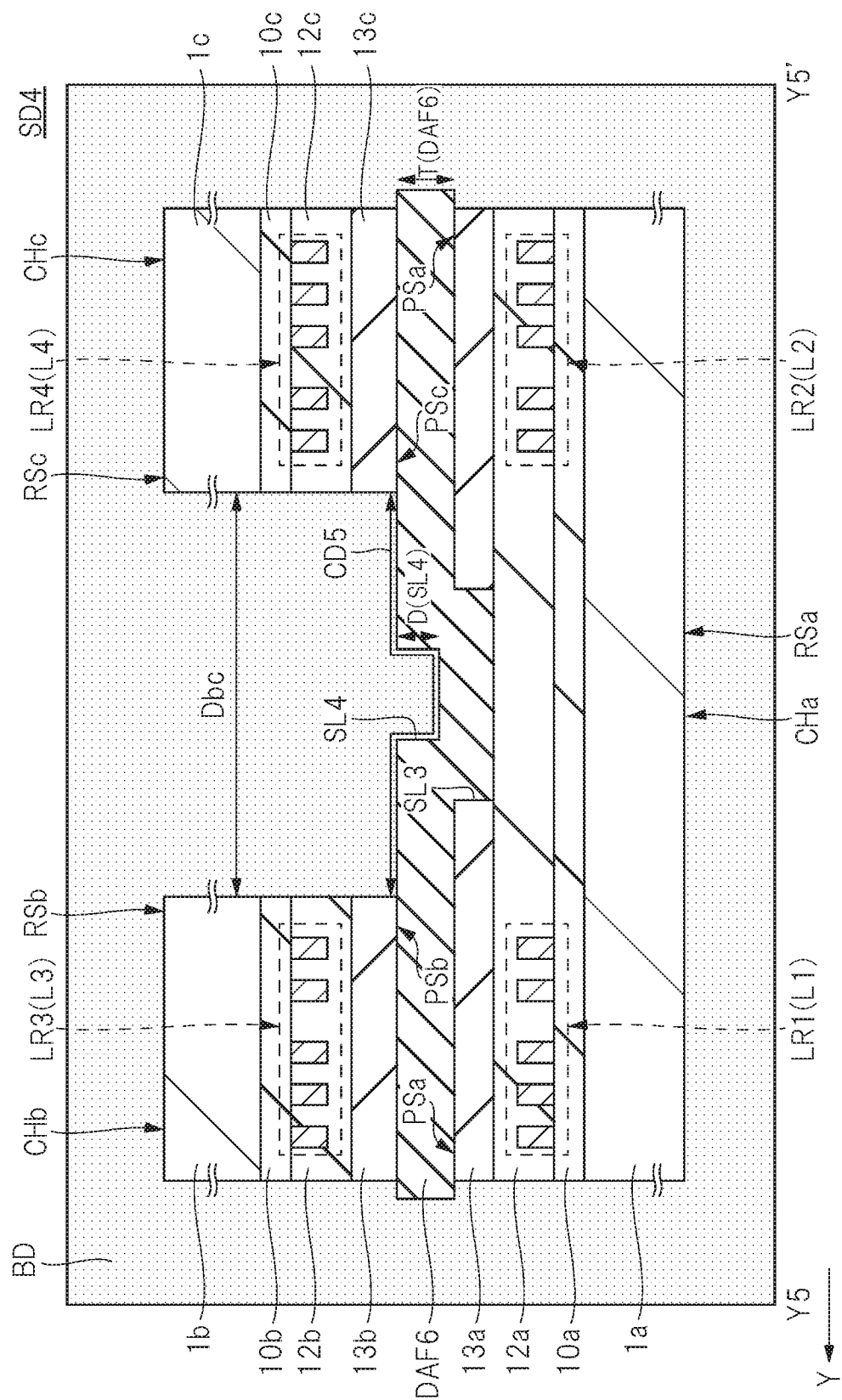
FIG. 23 is a cross-sectional view of main parts taken along line Y5-Y5' in FIG. 22.

FIG. 22 is a plan view of a semiconductor device according to a fourth modification example, and FIG. 23 is a cross-sectional view of main parts taken along line Y5-Y5' in FIG. 22. In a semiconductor device SD4 of the fourth modification example, a slit SL4 is formed in a surface of an insulative adhesion layer DAF6 between the semiconductor chips CHb and CHc.

As illustrated in FIGS. 22 and 23, the slit SL4 extending in the X direction is formed in the surface of the insulative adhesion layer DAF6 between the semiconductor chips CHb and CHc. By providing the slit SL4 in the surface of the insulative adhesion layer DAF6 between the semiconductor chips CHb and CHc, a creepage distance CD5 can become twice a depth D(SL4) of the slit SL4 as compared to the separation distance Dbc. Therefore, downsizing of the semiconductor device SD4 can be achieved.

By providing a slit SL3 having a large width in the protection film 13$a$ of the semiconductor chip CHa and providing the insulative adhesion layer DAF6 so as to cover the slit SL3, the slit SL4 is formed in the surface of the insulative adhesion layer DAF6.

As illustrated in FIG. 22, a length L(SL4) of the slit SL4 in the X direction is preferably longer than the distance L(CHb) of the region in which the semiconductor chip CHa and the semiconductor chip CHb overlap each other and the distance L(CHc) of the region in which the semiconductor chip CHa and the semiconductor chip CHc overlap each other.

In the foregoing, the invention made by the inventors of the present invention has been specifically described based on the embodiment. However, the present invention is not limited to the embodiment, and it is needless to say that the invention can be variously modified within the scope of the invention.

Additionally, the following description is a part of the contents of the embodiment described above.

[Additional Statement 1]

A method of manufacturing a semiconductor device including the steps of:

(a) preparing a first semiconductor chip having a first inductor element and a second inductor element between a first semiconductor substrate and a first main surface in cross-sectional view, a second semiconductor chip having a third inductor element between a second semiconductor substrate and a second main surface in cross-sectional view, and a third semiconductor chip having a fourth inductor element between a third semiconductor substrate and a third main surface in cross-sectional view;

(b) preparing a lead frame having a plurality of external terminals and a die pad;

(c) mounting the first semiconductor chip on the die pad;

(d) mounting the second semiconductor chip on the first semiconductor chip via a first insulative adhesion layer and mounting the third semiconductor chip on the first semiconductor chip via a second insulative adhesion layer; and (e) forming a sealing body by sealing the first semiconductor chip, the second semiconductor chip, the third semiconductor chip, the first insulative adhesion layer, and the second insulative adhesion layer, wherein the first inductor element and the second inductor element are arranged to be separated from each other in a first direction of the first main surface, and in the step (d), the first main surface and the second main surface are made to face each other such that the first inductor element and the third inductor element overlap each other in plan view, and the first main surface and the third main surface are made to face each other such that the second inductor element and the fourth inductor element overlap each other in plan view.

[Additional Statement 2]

The method of manufacturing a semiconductor device according to Additional Statement 1, wherein a creepage distance between the second semiconductor chip and the third semiconductor chip is larger than a first separation distance between the second semiconductor chip and the third semiconductor chip.

[Additional Statement 3]

The method of manufacturing a semiconductor device according to Additional Statement 2, wherein a second separation distance between the first insulative adhesion layer and the second insulative adhesion layer is smaller than the first separation distance.

[Additional Statement 4]

The method of manufacturing a semiconductor device according to Additional Statement 1, wherein, in the step (a), the first semiconductor chip covers the first inductor element and the second inductor element, and has a protection film with a slit between the first inductor element and the second inductor element, and in the step (e), the sealing body is formed in the slit.

[Additional Statement 5]

The method of manufacturing a semiconductor device according to Additional Statement 1, wherein, in the step (d), the first insulative adhesion layer and the second insulative adhesion layer are arranged between the second semiconductor chip and the third semiconductor chip so as to overlap each other.

[Additional Statement 6]

A method of manufacturing a semiconductor device including the steps of:

(a) preparing a first semiconductor chip having a first inductor element and a second inductor element between a first semiconductor substrate and a first main surface in cross-sectional view, a second semiconductor chip having a third inductor element between a second semiconductor substrate and a second main surface in cross-sectional view, and a third semiconductor chip having a fourth inductor element between a third semiconductor substrate and a third main surface in cross-sectional view;

(b) preparing a lead frame having a plurality of external terminals and a die pad;

(c) mounting the first semiconductor chip on the die pad;

(d) mounting the second semiconductor chip and the third semiconductor chip on the first semiconductor chip via an insulative adhesion layer; and (e) forming a sealing body by sealing the first semiconductor chip, the second semiconductor chip, the third semiconductor chip, and the insulative adhesion layer, wherein the first inductor element and the second inductor element are arranged to be separated from each other in a first direction of the first main surface, in the step (d), the first main surface and the second main surface are made to face each other such that the first inductor element and the third inductor element overlap each other in plan view, and the first main surface and the third main surface are made to face each other such that the second inductor element and the fourth inductor element overlap each other in plan view, and a slit is provided in a surface of the insulative adhesion layer between the second semiconductor chip and the third semiconductor chip.

[Additional Statement 7]

The method of manufacturing a semiconductor device according to Additional Statement 6, wherein, in the step (e), the slit is filled with the sealing body, and a creepage distance between the second semiconductor chip and the third semiconductor chip is larger than a separation distance between the second semiconductor chip and the third semiconductor chip.

What is claimed is:

1. A semiconductor device comprising:

a first semiconductor chip having a first inductor element and a second inductor element between a first semiconductor substrate and a first main surface in cross-sectional view;

a second semiconductor chip having a third inductor element between a second semiconductor substrate and a second main surface in cross-sectional view; and a third semiconductor chip having a fourth inductor element between a third semiconductor substrate and a third main surface in cross-sectional view, wherein the first inductor element and the second inductor element are arranged to be separated from each other in a first direction of the first main surface, the first main surface and the second main surface face each other, and the first inductor element and the third inductor element overlap each other in plan view, the first main surface and the third main surface face each other, and the second inductor element and the fourth inductor element overlap each other in plan view, and a creepage distance between the second semiconductor chip and the third semiconductor chip is larger than a separation distance between the second semiconductor chip and the third semiconductor chip.

2. A semiconductor device comprising:

a first semiconductor chip having a first inductor element and a second inductor element between a first semiconductor substrate and a first main surface in cross-sectional view;

a second semiconductor chip having a third inductor element between a second semiconductor substrate and a second main surface in cross-sectional view;

a third semiconductor chip having a fourth inductor element between a third semiconductor substrate and a third main surface in cross-sectional view;
a first insulative adhesion layer interposed between the first semiconductor chip and the second semiconductor chip;
a second insulative adhesion layer interposed between the first semiconductor chip and the third semiconductor chip; and
a sealing body for sealing the first semiconductor chip, the second semiconductor chip, the third semiconductor chip, the first insulative adhesion layer, and the second insulative adhesion layer,
wherein the first inductor element and the second inductor element are arranged to be separated from each other in a first direction of the first main surface,
the first main surface and the second main surface face each other, and the first inductor element and the third inductor element overlap each other via the first insulative adhesion layer in plan view,
the first main surface and the third main surface face each other, and the second inductor element and the fourth inductor element overlap each other via the second insulative adhesion layer in plan view, and
a creepage distance between the second semiconductor chip and the third semiconductor chip is larger than a first separation distance between the second semiconductor chip and the third semiconductor chip.

3. The semiconductor device according to claim 2, wherein the first insulative adhesion layer and the second insulative adhesion layer are arranged to be separated from each other in the first direction, and
a second separation distance between the first insulative adhesion layer and the second insulative adhesion layer is smaller than the first separation distance.

4. The semiconductor device according to claim 2, wherein the sealing body is in contact with the first main surface between the first insulative adhesion layer and the second insulative adhesion layer.

5. The semiconductor device according to claim 2, wherein the first semiconductor chip has a protection film covering the first inductor element and the second inductor element, and
a slit is formed in the protection film between the second semiconductor chip and the third semiconductor chip.

6. The semiconductor device according to claim 5, wherein the slit is filled with the sealing body.

7. The semiconductor device according to claim 6, wherein a depth of the slit is smaller than a thickness of the protection film.

8. The semiconductor device according to claim 5, wherein the second semiconductor chip overlaps the first semiconductor chip,
the slit extends in a second direction that is orthogonal to the first direction, and
a length of the slit is longer than a distance of an overlapped portion between the first semiconductor chip and the second semiconductor chip in the second direction.

9. The semiconductor device according to claim 2, wherein a part of the first insulative adhesion layer and a part of the second insulative adhesion layer overlap each other between the second semiconductor chip and the third semiconductor chip.

10. A semiconductor device comprising:
a first semiconductor chip having a first inductor element and a second inductor element between a first semiconductor substrate and a first main surface in cross-sectional view;
a second semiconductor chip having a third inductor element between a second semiconductor substrate and a second main surface in cross-sectional view;
a third semiconductor chip having a fourth inductor element between a third semiconductor substrate and a third main surface in cross-sectional view;
an insulative adhesion layer interposed between the first semiconductor chip and the second semiconductor chip and between the first semiconductor chip and the third semiconductor chip; and
a sealing body for sealing the first semiconductor chip, the second semiconductor chip, the third semiconductor chip, and the insulative adhesion layer,
wherein the first inductor element and the second inductor element are arranged to be separated from each other in a first direction of the first main surface,
the first main surface and the second main surface face each other, and the first inductor element and the third inductor element overlap each other via the insulative adhesion layer in plan view,
the first main surface and the third main surface face each other, and the second inductor element and the fourth inductor element overlap each other via the insulative adhesion layer in plan view,
the insulative adhesion layer has a first slit between the second semiconductor chip and the third semiconductor chip.

11. The semiconductor device according to claim 10, a creepage distance between the second semiconductor chip and the third semiconductor chip is larger than a separation distance between the second semiconductor chip and the third semiconductor chip.

12. The semiconductor device according to claim 10, wherein the sealing body is in contact with the insulative adhesion layer between the second semiconductor chip and the third semiconductor chip.

13. The semiconductor device according to claim 10, wherein the second semiconductor chip overlaps the first semiconductor chip,
the first slit extends in a second direction that is orthogonal to the first direction, and
a length of the first slit is longer than a distance of an overlapped portion between the first semiconductor chip and the second semiconductor chip in the second direction.

14. The semiconductor device according to claim 10, wherein the first semiconductor chip has a protection film covering the first inductor element and the second inductor element,
a second slit is formed in the protection film, and
a width of the second slit is larger than a width of the first slit in the first direction and the first slit is positioned more inward than the second slit in plan view.

* * * * *